US007969010B2

(12) United States Patent  
Usami

(10) Patent No.: US 7,969,010 B2  
(45) Date of Patent: Jun. 28, 2011

(54) SEMICONDUCTOR DEVICE AND MANUFACTURING PROCESS THEREFOR

(75) Inventor: Tatsuya Usami, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 11/362,110

(22) Filed: Feb. 27, 2006

(65) Prior Publication Data

US 2006/0211235 A1  Sep. 21, 2006

(30) Foreign Application Priority Data

Mar. 17, 2005 (JP) .................................. 2005-077720

(51) Int. Cl.
*H01L 21/31* (2006.01)
(52) U.S. Cl. .......................... 257/774; 438/618; 438/622
(58) Field of Classification Search .................. 438/618, 438/622; 257/774
See application file for complete search history.

(56) References Cited

U.S. PATENT DOCUMENTS

| 6,297,557 | B1 * | 10/2001 | Bothra ........................... 257/767 |
| 6,869,873 | B2 * | 3/2005 | Bradshaw et al. ............. 438/630 |
| 7,214,594 | B2 * | 5/2007 | Wong et al. ................... 438/319 |
| 2001/0021578 | A1 * | 9/2001 | Yasuda .......................... 438/622 |
| 2003/0089928 | A1 * | 5/2003 | Saito et al. .................... 257/213 |
| 2004/0232552 | A1 * | 11/2004 | Wang et al. ................... 257/758 |

FOREIGN PATENT DOCUMENTS

JP       2003-152077       5/2003

* cited by examiner

*Primary Examiner* — David Vu  
*Assistant Examiner* — Brandon Fox  
(74) *Attorney, Agent, or Firm* — Young & Thompson

(57) ABSTRACT

A semiconductor device has a semiconductor substrate, a first interconnect made of a copper-containing metal which is formed over the semiconductor substrate, a conductive first plug formed over the first interconnect and connected to the first interconnect, a Cu silicide layer over the first interconnect in an area other than the area where the first plug is formed, a Cu silicide layer over the first plug, and a first porous MSQ film formed over an area from the side surface of the first interconnect to the side surface of the first plug and covering the side surface of the first interconnect, the upper portion of the first interconnect and the side surface of the first plug.

10 Claims, 22 Drawing Sheets

SEMICONDUCTOR DEVICE AND MANUFACTURING PROCESS THEREFOR

This application is based on Japanese patent application NO. 2005-077720, the content of which is incorporated hereinto by reference.

BACKGROUND

1. Technical Field

This invention relates to a semiconductor device having a multilayer interconnect structure and a manufacturing process therefor.

2. Related Art

FIG. 21 is a cross-sectional view illustrating the configuration of a conventional semiconductor device. The semiconductor device 200 shown in FIG. 21 will be manufactured in accordance with the following procedure.

First, on a silicon substrate (not shown) are formed an $SiO_2$ film 201 and a SiC barrier dielectric film 203. On the barrier dielectric film 203 is then deposited a porous SiOC film as a first Low-k (low dielectric constant) film 205 to a thickness of about 70 to 200 nm. On the first Low-k film 205 is deposited a hard mask $SiO_2$ film (not shown) to a thickness of about 50 to 150 nm. Then, the hard mask $SiO_2$ film and the porous SiOC film as the first Low-k film 205 are etched with a fluorocarbon based gas and ashed by a photolithography process, to form an interconnect trench. After forming a barrier metal film 211 and a copper interconnect 213 in the interconnect trench, an SiC film is formed as a barrier dielectric film 207. Then, on the film is further formed a porous SiOC film as a second Low-k film 209, which is processed as described above, to form a via hole 215. Thus, there is provided the semiconductor device 200 shown in FIG. 21. Subsequently, a metal film is buried in the via hole 215 to form a via plug (not shown). The process is repeated to form a multilayer interconnect.

However, in the manufacturing process, as a dielectric constant of the insulating interlayer is decreased, film damage due to processing becomes more significant. Specifically, the process of etching and ashing with a fluorocarbon gas leads to formation of a damaged layer 217 in the exposed area in the first Low-k film 205 and the second Low-k film 209. In the area of the damaged layer 217, Si—$CH_3$ bonds in the Low-k film are broken, leading to increase in a dielectric constant of the Low-k film. Furthermore, since a barrier dielectric film 203 with a relatively higher specific dielectric constant exists on the copper interconnect 213, it is difficult to reduce an effective dielectric constant.

In addition, peeling may occur in a stacked portion where on a layer in which the copper interconnect 213 is to be formed, that is, an interconnect layer, a layer with via plug and a smaller metal area than the interconnect layer is formed. Specifically, adhesiveness is poor between the porous SiOC film as the second Low-k film 209 and the SiC film as the barrier dielectric film 207. Therefore, during a T/C (thermal cycle) test after forming a multilayer interconnect and assembling, the films may be peeled due to a difference in a thermal expansion coefficient between the films, leading to a peeled interface 219.

Thus, there has been proposed application of metal cap technique on an interconnect instead of a barrier dielectric film.

FIG. 22 is a cross-sectional view illustrating the configuration of such a semiconductor device. The semiconductor device 210 shown in FIG. 22 does not have a barrier dielectric film 207 in contrast to the semiconductor device 200 shown in FIG. 21, and thus requires an etching stopper during forming a via hole. Therefore, the semiconductor device 210 has a cap metal film 221 over the copper interconnect 213. Over the cap metal film 221 is formed a Cu plug consisting of a barrier metal film 225 and a Cu film 227, on which is formed a cap metal film 229.

The semiconductor device 210 shown in FIG. 22 will be manufactured in accordance with the following process. On an $SiO_2$ film (not shown) is formed an SiC barrier dielectric film 203, on which is then formed a porous SiOC film as a Low-k film. Then, an $SiO_2$ film is formed on the porous SiOC film, to obtain a first stacked film 233. Subsequently, the first stacked film 233 is processed by using photolithography technique, to form an interconnect trench. Then, there are sequentially formed a barrier metal film 211, a Cu seed (not shown) and a Cu plating film to be a copper interconnect 213, and then an interconnect is formed in the trench by CMP. Next, a CoWP layer as a cap metal film 221 is formed on the interconnect by selective growth.

Then, as described above, on the cap metal film 221 is formed a second stacked film 235, in which is then formed a via hole. After forming a plug consisting of a barrier metal film 225 and a Cu film 227 in the via hole, a CoWP layer as a cap metal film 229 is formed on the plug by selective growth.

Japanese patent application NO. 2003-152077 has disclosed that in a multilayer interconnect structure formed by a dual damascene process, a tungsten film is formed as a cap metal film and the tungsten film on the bottom of a contact hole is removed.

SUMMARY OF THE INVENTION

However, in the manufacturing process for the semiconductor device 210 shown in FIG. 22, selective growth of the cap metal film 221 and the cap metal film 229 is incomplete, so that a metal is deposited as non-selective deposits 223 and 231 on the insulating interlayers, that is, the first stacked film 233 and the second stacked film 235, respectively. The presence of the non-selective deposits 223 and 231 may cause leak between interconnects. Furthermore, although the via hole is formed in the second stacked film 235 on the CoWP film as the cap metal film 221 in the process after forming the cap metal film 221, the cap metal film 221 is not etched off. Therefore, as shown in FIG. 22, the barrier metal film 225 is formed on the cap metal film 221, leading to increase in a connection resistance between an interconnect and a via.

Japanese patent application NO. 2003-152077 as the related art has prepared an interconnect structure by a dual damascene process. However, when forming an interconnect or connection plug made of Cu by dual damascene process, a semiconductor device is manufactured in a poor yield and unstably. Furthermore, there is room for improvement for stably using a semiconductor device for a longer period. Thus, there have been needs for further improvement for obtaining a semiconductor device with higher device reliability.

Japanese patent application NO. 2003-152077 has described that a tungsten film on the bottom of a contact hole is removed by etching after forming the tungsten film on an interconnect. However, our investigation of the process has demonstrated that a removed material from the bottom may adhere to, for example, a sidewall of the contact hole, leading to insufficient removal. Thus, a barrier metal film may not be stably formed in the contact hole, leading to problems such as defective burying of a via.

In an aspect of the present invention, there is provided a semiconductor device having an interconnect structure, comprising a semiconductor substrate;

a first interconnect made of a copper-containing metal which is formed over the semiconductor substrate;

a conductive plug formed over the first interconnect and connected to the first interconnect;

a first cap metal film over the first interconnect in an area other than the area where the plug is formed;

a plug protecting film formed over the plug; and an insulating film formed over an area from the side surface of the first interconnect to the side surface of the plug and covering the side surface of the first interconnect, the upper portion of the first interconnect and the side surface of the plug.

In this invention, the first cap metal film is formed in the area over the first interconnect other than the area where the plug is formed. Thus, a contact resistance between the first interconnect and the plug can be effectively reduced. Furthermore, the upper portion of the first interconnect can be reliably protected while preventing electromigration or stress-migration.

In addition, the insulating film is formed in the area from the sidewall of the first interconnect to the sidewall of the via, such that the insulating film covers the sidewall of the first interconnect, the upper portion of the first interconnect and the sidewall of the via. Here, the border between the lower first interconnect-forming layer and the upper via-forming layer is a region where a data ratio in the insulating film discontinuously and considerably varies. When films made of different materials are formed in such a region, detachment may be caused in an interface between the films. In accordance with this invention, there may be provided a configuration without films made of different materials in the border between the first interconnect-forming layer and the via-forming layer. Thus, this invention can prevent detachment of the insulating film in the border between the first interconnect-forming layer and the via-forming layer. Furthermore, since there are formed no films made of different materials, a dielectric constant of the insulating film can be effectively reduced.

In the present specification, the term "data ratio" refers to an areal proportion occupied by a metal film in an insulating film. In general, a layer with an interconnect has a higher data ratio while a layer with a via has a lower data ratio, and there is a significant difference in a data ratio between these layers.

In this invention, the insulating film may be formed as a continuously integral part from the sidewall of the first interconnect to the sidewall of the via. In the present specification, the term "continuously integral" means that a film is formed as a continuous and integral part. It preferably has a structure made of a single member without a joint. If an insulating film is a stack of multiple films, there is an interface between films where detachment may occur. The configuration of this invention does not have such an interface, resulting in further improvement in thermal cycle properties of an insulating film. Furthermore, a dielectric constant of the insulating film can be more effectively reduced.

In another aspect of this invention, there is provided a process for manufacturing a semiconductor device, comprising forming a first sacrificial insulating interlayer over a semiconductor substrate and burying a copper-containing metal film in the first sacrificial insulating interlayer to form a first interconnect;

forming a second sacrificial insulating interlayer over the first sacrificial insulating interlayer, selectively removing the second sacrificial insulating interlayer to form a hole, exposing a part of the upper surface of the first interconnect from the bottom of the hole, and burying a copper-containing metal film in the hole to form a plug connected to a part of the upper surface of the first interconnect;

after the forming of the plug, removing the second sacrificial insulating interlayer to expose the upper surface of the first interconnect;

after the exposing of the upper surface of the first interconnect, simultaneously forming cap metal films over the first interconnect and the plug; and after the simultaneous forming of the cap metal films, removing the first sacrificial insulating interlayer to expose the side surface of the first interconnect and forming an insulating film covering the side surface of the first interconnect, the upper portion of the first interconnect and the side surface of the plug.

In the manufacturing process of this invention, cap metal films are simultaneously formed over the first interconnect and the plug, so that the upper portion of the first interconnect can be protected. Furthermore, a cap metal film is not formed between the plug and the first interconnect, so that a semiconductor device which can effectively reduce a contact resistance can be stably produced. The process can eliminate the step of removing the cap metal over the first interconnect, resulting in improved stability in manufacturing the plug and thus an improved production yield.

Furthermore, after removing the first sacrificial insulating interlayer, the sacrificial barrier dielectric film and the second sacrificial insulating interlayer to expose the first interconnect and the plug, the insulating film is formed, which covers the side surface of the first interconnect, the upper portion of the first interconnect and the side surface of the plug. Therefore, the process can eliminate the step of forming a trench or hole by selectively removing the insulating film after forming the film, resulting in prevention of damage due to processing of the insulating film.

The first and the second sacrificial insulating interlayers may be formed as a single layer film or a stack of multiple films.

As described above, a connection resistance between the plug and the interconnect and a dielectric constant of the insulating film can be effectively reduced in accordance with the present invention.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

There will be described some embodiments of this invention with reference to the drawings, for production of a semiconductor device having a multilayer interconnect structure made of a copper-containing metal by a single damascene process. In all the drawings, a common element is indicated by the same symbol and a common description will not be repeated in the following description, appropriately.

Embodiment 1

Figure 1:
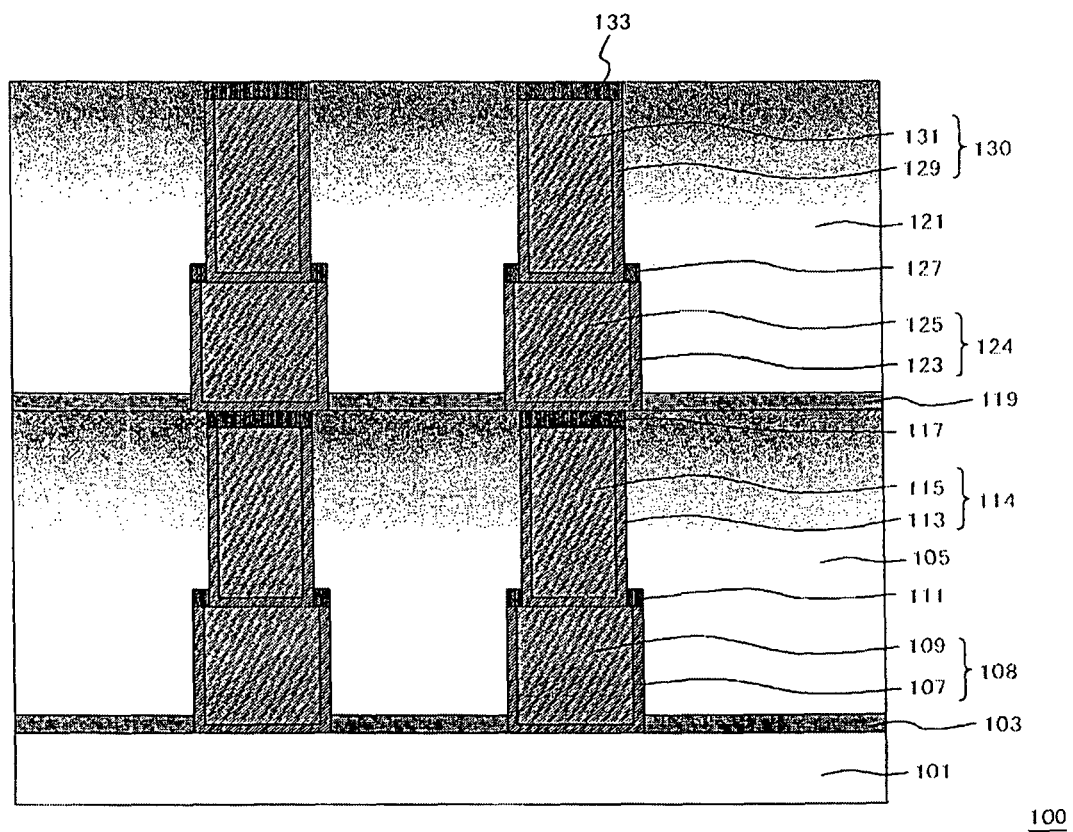
FIGS. 1 and 2 are cross-sectional views illustrating the configuration of a semiconductor device according to an embodiment.
Figure 2:
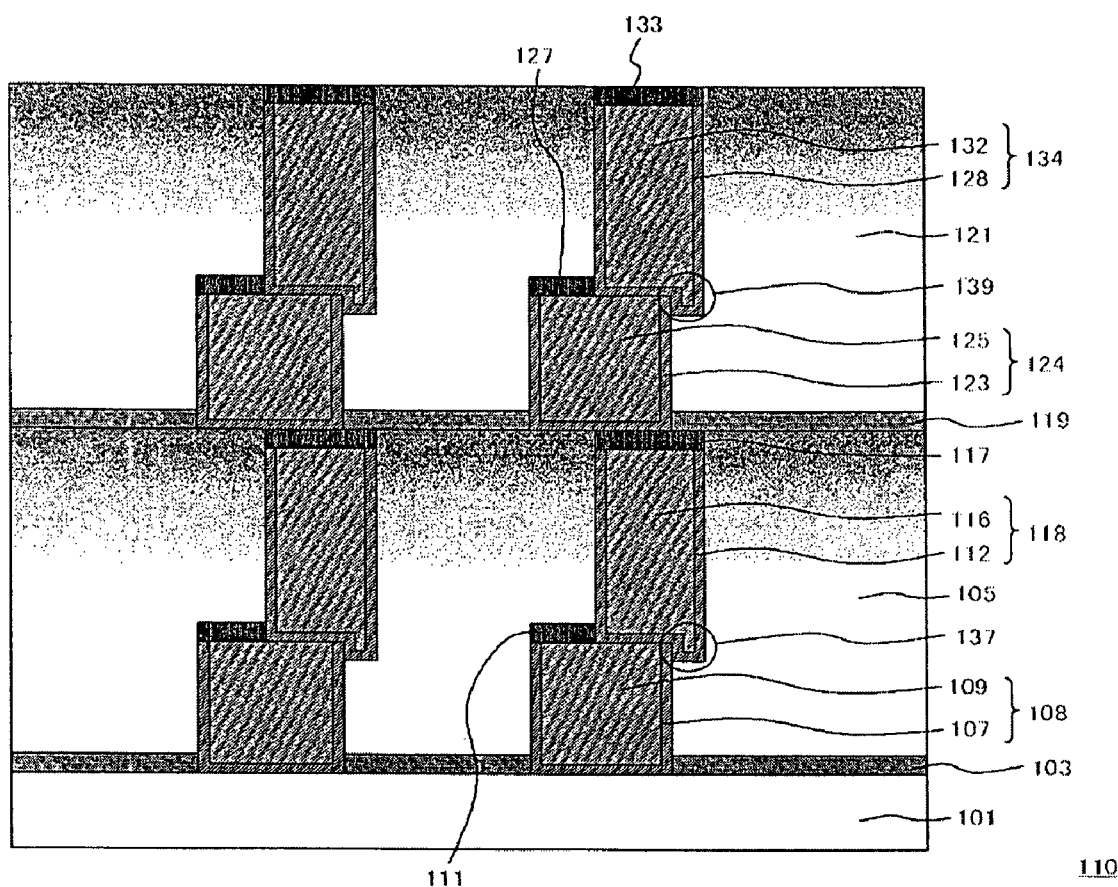

FIGS. 1 and 2 are cross-sectional views illustrating the configuration of a semiconductor device according to this embodiment. A semiconductor device 110 shown in FIG. 2 is a semiconductor device 100 shown in FIG. 1, in which there is a misalignment in a junction between an interconnect and a via.

The semiconductor device 100 shown in FIG. 1 has a semiconductor substrate (not shown) and an interconnect structure having a first interconnect 108 made of a copper-containing metal over the semiconductor substrate; a conductive plug (first plug 114) over the first interconnect 108, which is connected to the first interconnect 108; a first cap metal film (Cu silicide layer 111) over the first interconnect 108 in an area other than the area where the first plug 114 is formed; a plug protecting film (Cu silicide layer 117) over the first plug 114; and an insulating film (a first porous MSQ film 105) formed in the region from the side surface of the first interconnect 108 to the side surface of the first plug 114, which covers the side surface of the first interconnect 108, the upper portion of the first interconnect 108 and the side surface of the first plug 114.

In this embodiment, the first cap metal is the Cu silicide layer 111 formed over the first interconnect 108, which is a film formed by siliciding the upper portion of the first interconnect 108. The first plug 114 is in direct contact with the first interconnect 108, and in an area not in contact with the first plug 114, the upper portion of the first interconnect 108 is selectively silicided.

The plug protecting film is a second cap metal film made of the same material as the Cu silicide layer 111, that is, the Cu silicide layer 117. The Cu silicide layer 117 is formed by the same process as the Cu silicide layer 111, as described later. A second interconnect 124 is provided over the first plug 114 which is connected to the first plug 114 via the Cu silicide layer 117.

The semiconductor device 100 has a first reinforcing insulating film (a first SiC film 103) which is under the first porous MSQ film 105, is in contact with the bottom of the side surface of the first interconnect 108, and has a higher film density than the first porous MSQ film 105. An SiN or SiON film may be used instead of the first SiC film 103.

The first porous MSQ film 105 is formed as a continuously integral part from the side surface of the first interconnect 108 to the side surface of the first plug 114. The first porous MSQ film 105 is a solid film buried between the interconnects in the first interconnect 108 and between the first plugs 114.

The first porous MSQ film 105 is made of a material with a low dielectric constant and its film density is higher in its upper part (the distal side from the silicon substrate) than its lower part. Mechanical strength of the first porous MSQ film 105 is higher in its upper part than its lower part. The first porous MSQ film 105 is made of a material with a low dielectric constant which contains carbon as a constituent element, and its upper part has a higher carbon concentration than its lower part.

The first porous MSQ film 105 is formed by electron beam irradiation or UV ray irradiation.

In an infrared spectrum of a low dielectric constant material, a peak intensity $I_1$, in an infrared absorption band having a peak around 1150 $cm^{-1}$ is lower in the upper part than in the lower part in the first porous MSQ film 105. The absorption band reflects a Cage type Si—O structure. A wave number around 1150 $cm^{-1}$ is, for example, 1100 to 1200 $cm^{-1}$.

In an infrared spectrum of a low dielectric constant material, a peak intensity $I_2$ in an infrared absorption band having a peak around 1050 $cm^{-1}$ is higher in the upper part than in the lower part in the first porous MSQ film 105. The absorption band reflects a Ladder type Si—O structure. A wave number around 1050 $cm^{-1}$ is, for example, 1000 to 1100 $cm^{-1}$.

In an infrared spectrum of a low dielectric constant material, a peak intensity $I_3$ in an infrared absorption band having a peak around 3000 $cm^{-1}$ is lower in the upper part than in the lower part in the first porous MSQ film 105. The absorption band reflects a C—H bond. As $I_3$ is higher, a carbon concentration in the film is higher. A wave number around 3000 $cm^{-1}$ is, for example, 2950 to 3050 $cm^{-1}$.

In the present specification, the term "peak intensity" refers to a difference of an absorbance at a peak position from a baseline absorbance at the wave number of the peak position in an infrared absorption band in an infrared spectrum, that is, an area surrounded by an absorption curve and a baseline. The baselines for the individual infrared absorption bands can be generally drawn within the following ranges.

$I_1$: 1100 to 1200 $cm^{-1}$
$I_2$: 1000 to 1100 $cm^{-1}$
$I_3$: 3050 to 2800 $cm^{-1}$.

In the semiconductor device 100, a plurality of such interconnect structures are stacked, and the first plug 114 in the lower interconnect structure is connected to the first interconnect (the second interconnect 124) in the upper interconnect structure.

The semiconductor device 100 has a second interconnect (a second interconnect 124) which is formed over the Cu silicide layer 117, connected to the first plug 114, and made of a copper-containing metal; and a second reinforcing insulating film (a second SiC film 119) which is an upper layer of the first porous MSQ film 105 while being in contact with the lower sidewall of the second interconnect 124 and has a higher film density than the first porous MSQ film 105. There is formed a second porous MSQ film 121 over the second SiC film 119, and the second SiC film 119 has a higher film density than the second porous MSQ film 121.

There will be more detailed the configuration of the semiconductor device 100.

The semiconductor device 100 has a configuration where on a silicon substrate (not shown) are sequentially formed the SiO$_2$ film 101, the first SiC film 103, the first porous MSQ film 105, the second SiC film 119 and the second porous MSQ film 121.

The first porous MSQ film 105 is a continuously integral film having a first plug 114 and an area except around the bottom of the first interconnect 108. The second porous MSQ film 121 is a continuously integral film having a second plug 130 and an area except around the bottom of the second interconnect 124.

In the first porous MSQ film 105 are buried the first interconnect 108, the first plug 114 and the Cu silicide layer 117 such that they are mutually connected in sequence. In the second porous MSQ film 121 are buried the second interconnect 124 connected to the Cu silicide layer 117, the second plug 130 and the Cu silicide layer 133 such that they are mutually connected in sequence. The first plug 114 and the second plug 130 are conductive via plugs connected to an interconnect.

The first interconnect 108 is formed in the region from the first porous MSQ film 105 to the first SiC film 103, and is comprised of the first Cu interconnect 109 and the barrier metal film 107 covering the side surface and the bottom surface of the first Cu interconnect 109. The first interconnect 108 is provided in contact with the first plug 114, and the upper surface of the first interconnect 108 is covered by the Cu silicide layer 111 in the area other than the contact area with the first plug 114. The first interconnect 108 is supported by the first SiC film 103 in the lower side surface and fixed on the SiO$_2$ film 101.

On the first interconnect 108 is formed the first plug 114 electrically connected to the first interconnect 108. The first plug 114 is comprised of the first Cu via 115 and the barrier metal film 113 covering the side surface and the bottom surface of the first Cu via 115, and the upper surface of the first Cu via 115 is covered by the Cu silicide layer 117.

The second interconnect 124 is formed in the region from the second porous MSQ film 121 to the second SiC film 119, and is comprised of the second Cu interconnect 125 and the barrier metal film 123 covering the side surface and the bottom surface of the second Cu interconnect 125. The second interconnect 124 is formed in contact with the second plug 130, and the upper surface of the second interconnect 124 is covered by the Cu silicide layer 127 in the area other than the contact area with the second plug 130. The second interconnect 124 is supported by the second SiC film 119 in the lower side surface and fixed on the first porous MSQ film 105.

On the second interconnect 124 is formed the second plug 130 electrically connected to the second interconnect 124. The second plug 130 is comprised of the second Cu via 131 and the barrier metal film 129 covering the side surface and the bottom surface of the second Cu via 131, and the upper surface of the second Cu via 131 is covered by the Cu silicide layer 133.

The first porous MSQ film 105 and the second porous MSQ film 121 are insulating interlayers made of a low dielectric constant material. The first porous MSQ film 105 and the second porous MSQ film 121 are formed by UV ray or electron beam irradiation from the upper surface side. A wavelength of the UV-ray may be, for example, 100 nm to 400 nm both inclusive. Furthermore, the first porous MSQ film 105 and the second porous MSQ film 121 have a higher film density in the upper part than in the lower part, that is, the side of the silicon substrate, to be mechanically reinforced. In the first porous MSQ film 105 and the second porous MSQ film 121, the upper part of the film may, for example, have mechanical strength as twice or more as the lower part. Thus, strength of the upper part in the area with a lower data ratio where the first plug 114 is to be formed can be more reliably increased, resulting in further improvement in production stability.

When mechanical strength should be further improved, the post-process conditions can be controlled to readily reduce a carbon concentration in the upper layer. Consequently, the reduction in a carbon concentration can be easily observed by an appropriate method such as SIMS (secondary ion mass spectrometry) or XPS (X-ray photoelectron spectrometry).

In the first porous MSQ film 105 and the second porous MSQ film 121, the amount of C—H bonds in the porous MSQ may be smaller in the upper part than the lower part; the amount of Ladder type Si—O bonds may be increased in the porous MSQ; the amount of Cage type Si—O bonds may be reduced in the porous MSQ; or two or more of these conditions may be simultaneously met. Such variation in the bond amount can be detected by, for example, infrared absorption spectrometry.

In the first porous MSQ film 105 and the second porous MSQ film 121, it is essential that the upper and the lower parts are different in film-composition properties and/or physical properties such as a film density, mechanical strength, the amount of C—H bonds in the porous MSQ, the amount of Ladder type Si—O bonds in the porous MSQ and the amount of Cage type Si—O bonds in the porous MSQ; for example, the properties may gradually vary as a distance from the first SiC film 103 is increased.

The semiconductor device 100 has a configuration where a discontinuous plane where the composition or physical properties in the first porous MSQ film 105 or the second porous MSQ film 121 discontinuously vary is not positioned in a discontinuous plane where a data ratio discontinuously varies. In particular, when a region with a low data ratio is placed over a region with a high data ratio, there is not a discontinuous plane for the composition or physical properties of the porous MSQ film in the level of the bottom of the region with a low data ratio. Specifically, there is not a discontinuous plane for the composition or physical properties of the first porous MSQ film 105 or the second porous MSQ film 121 in the same level as the boundary plane between the first interconnect 108 and the first plug 114 or the second interconnect 124 and the second plug 130, respectively.

Furthermore, there is not a discontinuous plane for the composition or physical properties of the first porous MSQ film 105 or the second porous MSQ film 121 at least in the region from the same level as the bottom of the first interconnect 108 to the same level as the bottom of the first plug 114 or from the same level as the bottom of the second interconnect 124 to the same level as the bottom of the second plug 130 both inclusive, respectively.

There may be a discontinuous plane for the composition or physical properties of the first porous MSQ film 105 or the second porous MSQ film 121 in the region which is above the bottom of the first plug 114 and in the level equal to or lower than the upper surface of the first plug 114 or the region which is above the bottom of the second plug 130 and in the level equal to or lower than the upper surface of the second plug 130, respectively. It is more preferable that the first porous MSQ film 105 or the second porous MSQ film 121 does not have a discontinuous plane for the composition or physical properties over the whole film. Thus, thermal cycle properties of the first porous MSQ film 105 and the second porous MSQ film 121 can be further improved.

The first SiC film 103 and the second SiC film 119 are in contact with the lower side surfaces of the first interconnect 108 and of the second interconnect 124, respectively, and act as a supporting film for the first interconnect 108 and the second interconnect 124, respectively. The second SiC film 119 intervenes between the second porous MSQ film 121 and the first porous MSQ film 105 in the border of the first plug 114 and the second interconnect 124 where a data ratio in a metal film is sharply and significantly increased, and thus acts as a reinforcing film which reinforces the region between interconnect structures.

The semiconductor device 110 shown in FIG. 2 has the basic configuration as described for the semiconductor device 100 shown in FIG. 1, except that the first plug 118 consisting of the barrier metal film 112 and the first Cu via 116 is substituted for the first plug 114 and the first plug 118 has a misalignment 137 and that the second plug 134 consisting of the barrier metal film 128 and the second Cu via 132 is substituted for the second plug 130 and the second plug 134 has a misalignment 139.

Next, there will be described a process for manufacturing the semiconductor device shown in FIG. 1. FIGS. 3 to 11 are cross-sectional views illustrating a manufacturing process for the semiconductor device 100.

The manufacturing process of this embodiment includes forming a first sacrificial insulating interlayer (a first sacrificial $SiO_2$ film 141) over a semiconductor substrate (not shown) and burying a copper-containing metal film in the first sacrificial $SiO_2$ film 141 to form a first interconnect 108; forming a second sacrificial insulating interlayer (a sacrificial SiC film 143 and a second sacrificial $SiO_2$ film 145) over the first sacrificial $SiO_2$ film 141, selectively removing the sacrificial SiC film 143 and the second sacrificial $SiO_2$ film 145 to form a hole (a via hole 147) for exposing a part of the upper surface of the first interconnect 108 from the bottom of the via hole 147, and burying a copper-containing metal film in the via hole 147 to form a plug (a first plug 114) connected to a part of the upper surface of the first interconnect 108; after forming the first plug 114, removing the sacrificial SiC film 143 and the second sacrificial $SiO_2$ film 145 to expose the upper surface of the first interconnect 108; after exposing the upper surface of the first interconnect 108, simultaneously forming cap metal films (a Cu silicide layer 111 and a Cu silicide layer 117) over the first interconnect 108 and over the first plug 114; after simultaneously forming the Cu silicide layer 111 and the Cu silicide layer 117, removing the first sacrificial $SiO_2$ film 141 to expose the side surface of the first interconnect 108 and forming an insulating film (a first porous MSQ film 105) covering the side surface of the first interconnect 108, the upper portion of the first interconnect 108 and the side surface of the first plug 114.

The manufacturing process of this embodiment further includes, after forming the first porous MSQ film 105, performing mechanical chemical polishing of the first porous MSQ film 105 using the Cu silicide layer 117 as a mask while stopping polishing by the Cu silicide layer 117 formed over the first plug 114.

The manufacturing process of this embodiment further includes, after forming the first porous MSQ film 105, forming a third sacrificial insulating interlayer (not shown) over the first porous MSQ film 105 and burying a copper-containing metal film in the third sacrificial insulating interlayer to form a second interconnect 124 connected to the first plug 114.

The simultaneously forming the Cu silicide layer 111 and the Cu silicide layer 117 is the simultaneously siliciding the upper surfaces of the first interconnect 108 and of the first plug 114.

The forming the reinforcing insulating film (the first SiC film 103) over the semiconductor substrate before forming the first sacrificial $SiO_2$ film 141 and forming the first interconnect 108 include selectively removing the first sacrificial $SiO_2$ film 141 and the first SiC film 103 in sequence to form a trench penetrating the first sacrificial $SiO_2$ film 141 and the first SiC film 103 and burying a copper-containing metal film in the trench.

There will be more detailed the process for manufacturing the semiconductor device 100.

Figure 3:
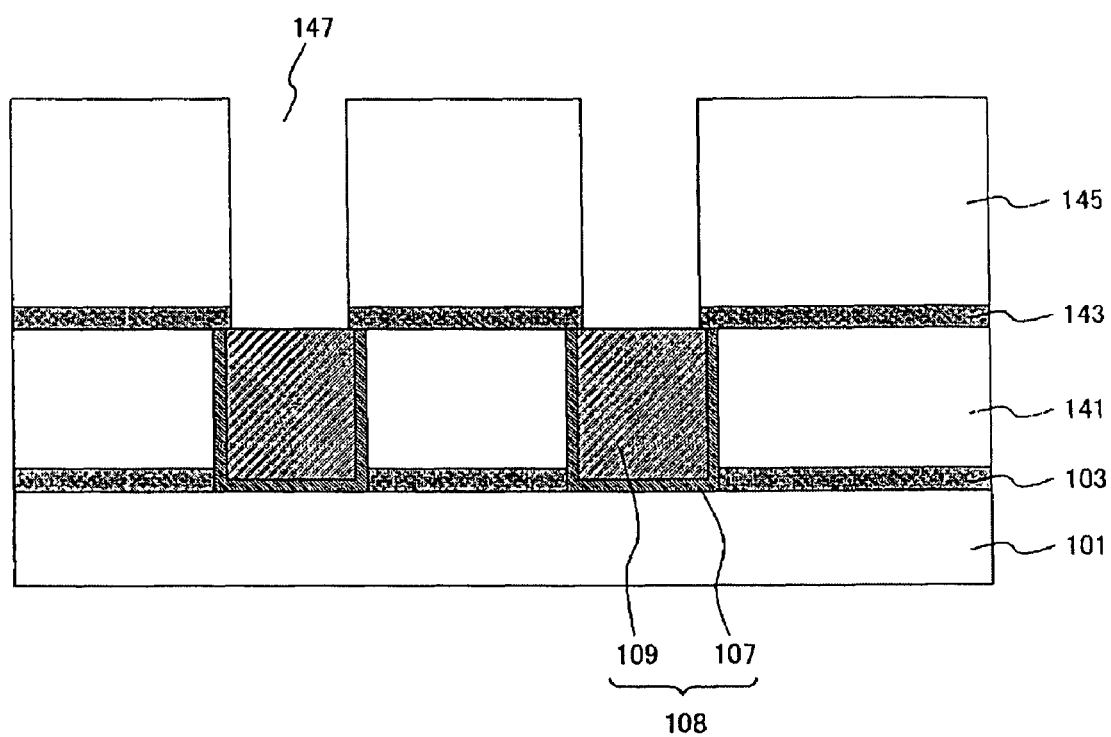
FIGS. 3 to 11 are cross-sectional views illustrating a process for manufacturing the semiconductor device shown in FIG. 1.

First, as shown in FIG. 3, on an $SiO_2$ film 101 is formed a first SiC film 103 as an SiC based reinforcing insulating film to a thickness of about 20 to 50 nm, and then a first sacrificial $SiO_2$ film 141 as a first sacrificial interlayer film to a thickness of about 70 to 200 nm. The first sacrificial $SiO_2$ film 141 is processed by lithography and then, the first SiC film 103 is etched back to form an interconnect trench.

Next, a Ta metal film is formed as a barrier metal film 107 to about 10 to 30 nm. Then, a Cu seed film (not shown) is formed by sputtering to about 50 to 150 nm. Subsequently, a Cu plating film is formed by plating technique to about 200 to 600 nm such that the film buries the interconnect trench, and CMP (Chemical Mechanical Polish) is conducted to form a first interconnect 108 buried in the interconnect trench.

Then, over the first interconnect 108 is formed a sacrificial SiC film 143 to about 20 to 50 nm. Next, over the sacrificial SiC film 143 is formed a second sacrificial $SiO_2$ film 145 to about 70 to 200 nm. After patterning the second sacrificial $SiO_2$ film 145 by lithography, the sacrificial SiC film 143 is etched back to form a via hole 147 penetrating the second sacrificial $SiO_2$ film 145 and the sacrificial SiC film 143 (FIG. 3).

Figure 4:
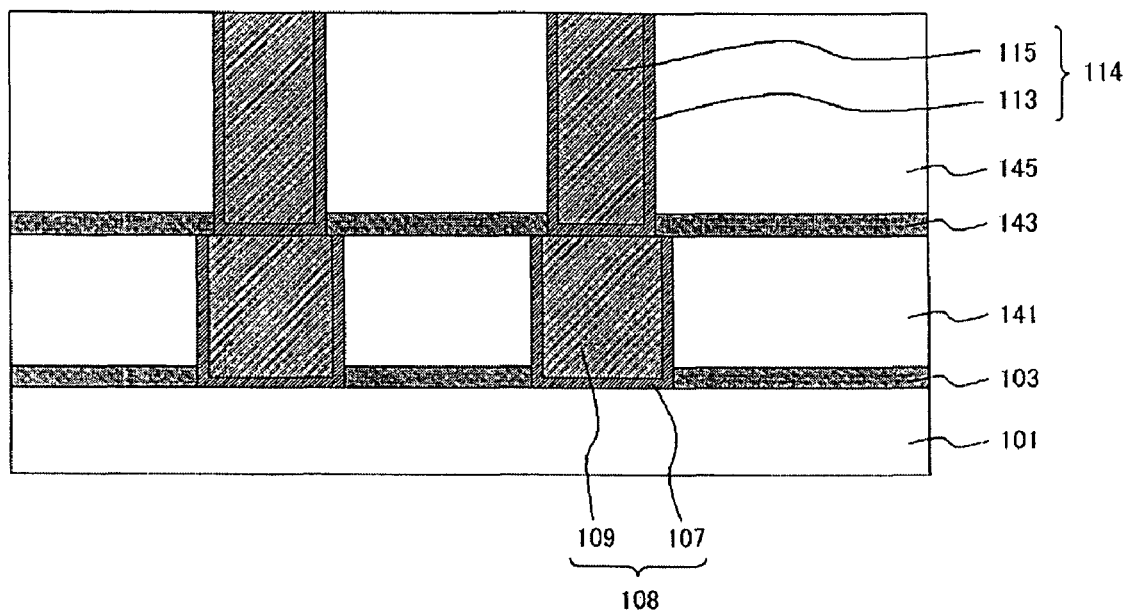

Then, over the whole upper surface of the second sacrificial $SiO_2$ film 145 is formed a Ta metal film as a barrier metal film 113 to about 10 to 30 nm. Next, a Cu seed film (not shown) is formed by sputtering to about 50 to 150 nm. Subsequently, a Cu plating film is grown starting from the Cu seed film by plating technique to about 100 to 300 nm to bury the via hole 147 with the Cu plating film. Then, the Cu plating film formed outside of the via hole 147 is removed by CMP to form a first Cu via 115. Thus, a first plug 114 buried in the via hole 147 is formed (FIG. 4).

Figure 5:
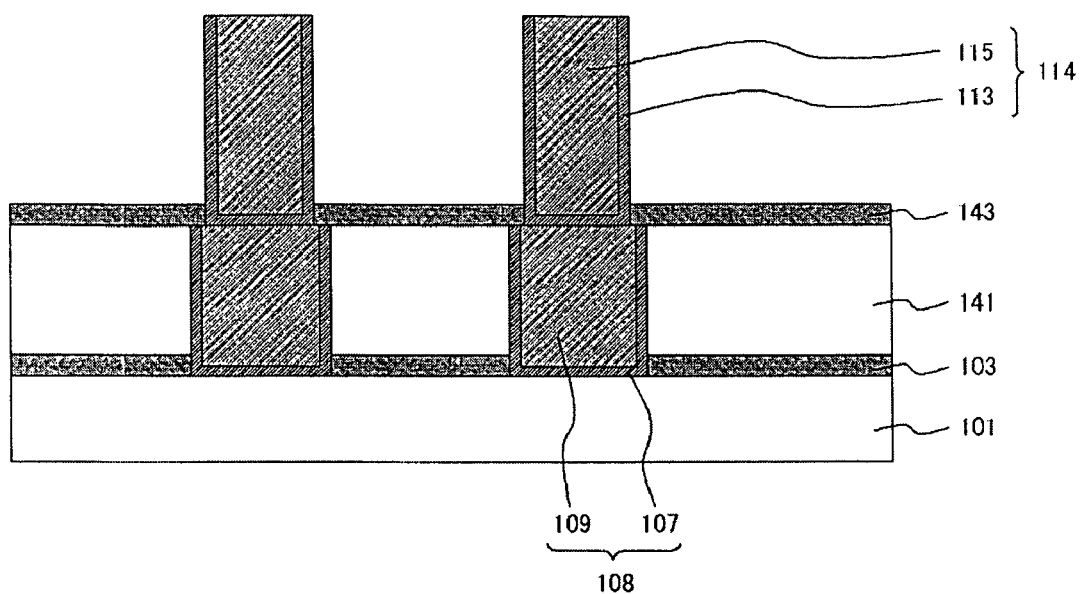
Figure 6:
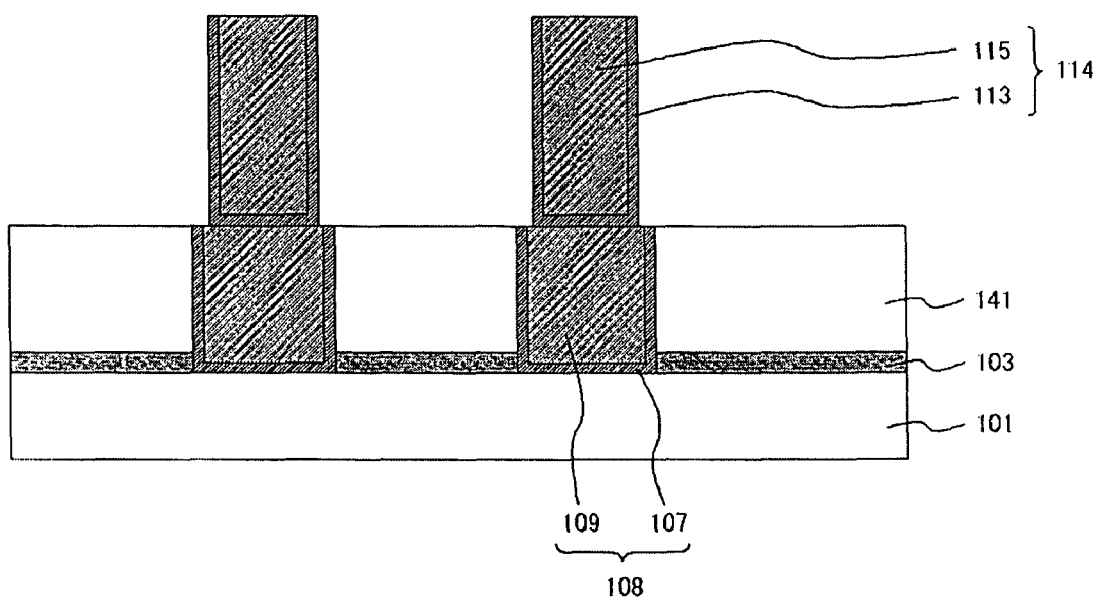

Next, the second sacrificial $SiO_2$ film 145 is removed by wet etching, using the Cu silicide layer 117 as an etching mask (FIG. 5). An etchant may be, for example, buffered HF (hydrofluoric acid). Then, the sacrificial SiC film 143 is etched backed and off by dry etching. Thus, the upper surfaces of the first plug 114 and the first interconnect 108 are exposed (FIG. 6).

Figure 7:
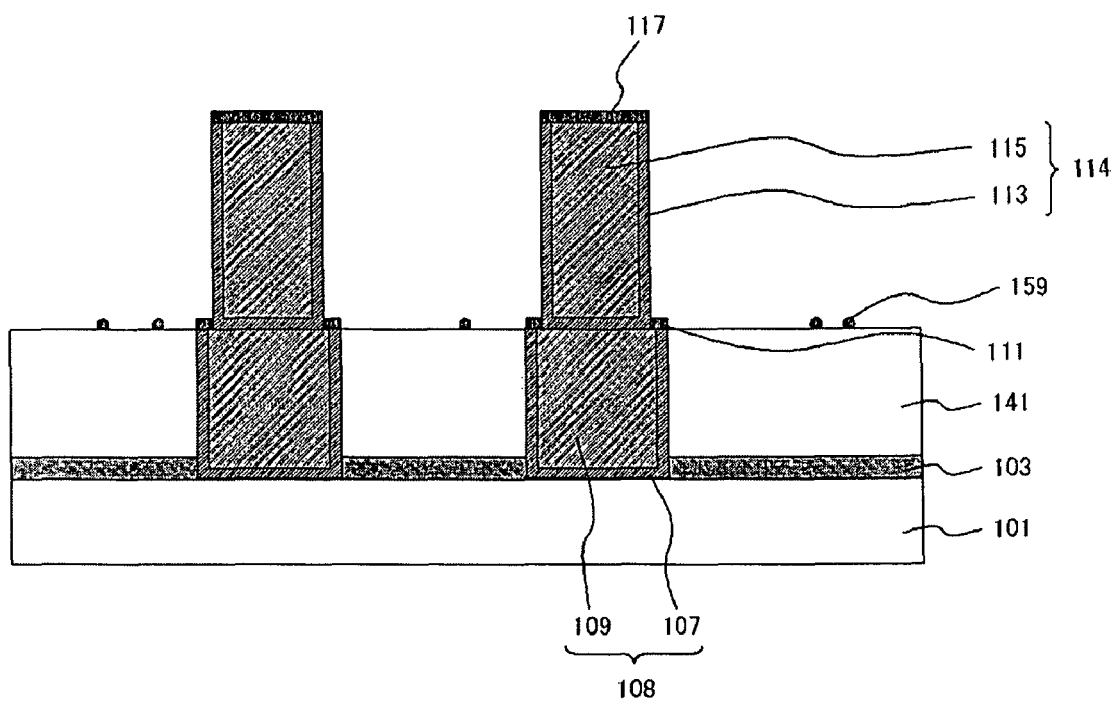

Subsequently, the upper surfaces of the first interconnect 108 and the first plug 114 are silicided, specifically $SiH_4$-treated, using metal capping technique to selectively form a Cu silicide ($CuSi_x$) layer 111 and a Cu silicide layer 117 acting as a cap metal to a film thickness of about 2 to 15 nm over the first interconnect 108 and over the first plug 114, respectively. Here, in the upper surface of the first interconnect 108, the Cu silicide layer 111 is formed only in a non-contact area with the first plug 114. By the step, over the first sacrificial $SiO_2$ film 141 is also formed an Si reaction product as a non-selective deposit 159 (FIG. 7).

Figure 8:
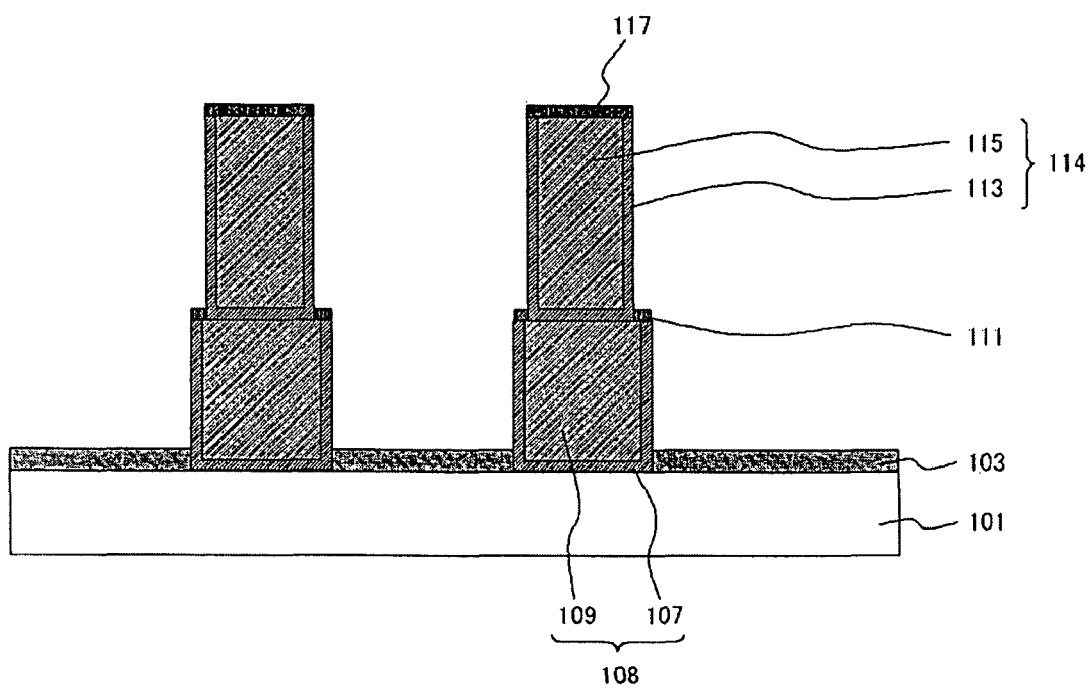

Then, the first sacrificial $SiO_2$ film 141 is etched off by wet etching with buffered HF (FIG. 8). During the process, as the first sacrificial $SiO_2$ film 141 is removed, the non-selective deposit 159 as a non-selectively grown contaminant over the first sacrificial $SiO_2$ film 141 is removed by a lift-off method to expose the surface of the first SiC film 103 while the first interconnect 108 and the first plug 114 remain, and to expose the side surface of the first interconnect 108.

Figure 9:
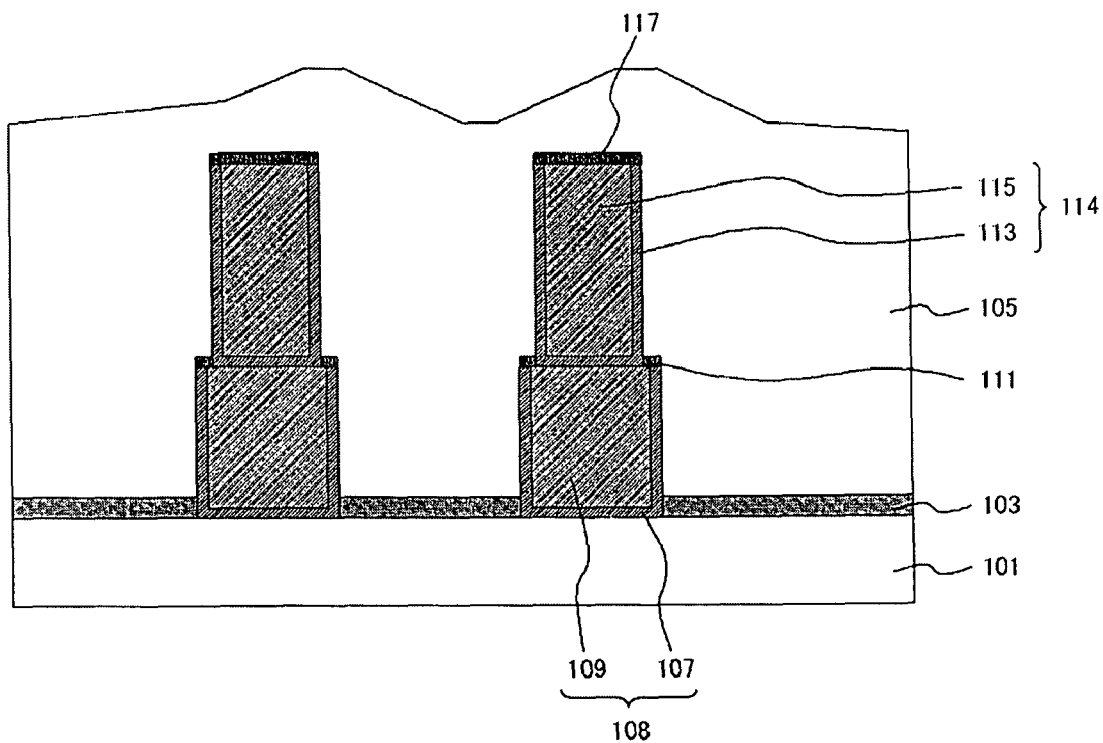
Figure 10:
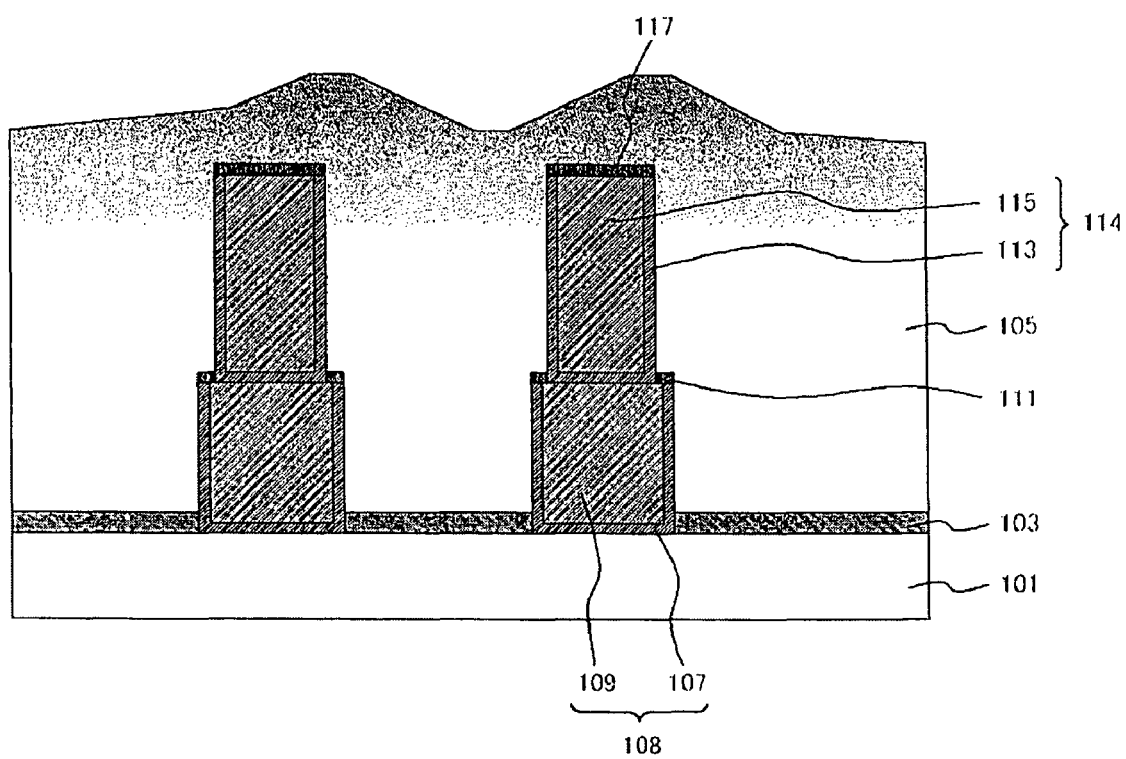
Figure 11:
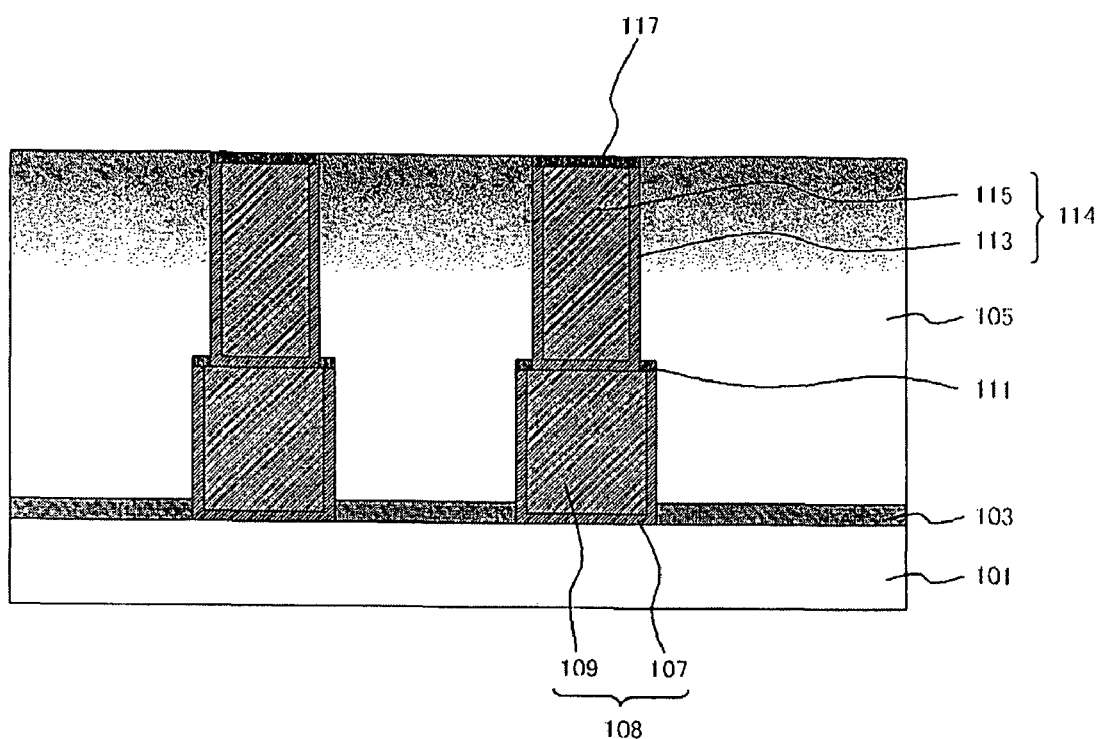

Then, after completely removing the insulating film formed as a sacrificial film, the first porous MSQ film 105 is applied to about 70 to 200 nm such that it covers the whole upper surface of the silicon substrate (not shown) and buries the region between the first interconnects 108, and then fired, to form an insulating film in contact with the first plug 114 and the first interconnect 108 (FIG. 9). Then, the whole upper surface of the first porous MSQ film 105 is EB-treated by EB (electron beam) irradiation or UV-treated by UV irradiation using a UV lamp to highly reinforce the upper portion in the first porous MSQ film 105 (FIG. 10). Then, the first porous MSQ film 105 is CMP-treated using the Cu silicide layer 117 as a CMP stopper, to planarize the surface of the first porous MSQ film 105 (FIG. 11).

Next, the above procedure is repeated from the forming the second SiC film 119, to form a barrier metal film 123, a second Cu interconnect 125, a barrier metal film 129 and a second Cu via 131 in the sacrificial film. Then, a part of the sacrificial layer is removed to expose the upper surfaces of the second interconnect 124 and the second plug 130. A Cu silicide layer 127 and a Cu silicide layer 133 are formed and then the sacrificial film and a non-selective deposit on the sacrificial film are removed. Subsequently, a second porous MSQ film 121 is buried in the removed area and highly reinforcing it. Thus, a multilayer interconnect structure shown in FIG. 1 is formed on the silicon substrate (not shown) to provide the semiconductor device 100.

The semiconductor device 110 shown in FIG. 2 is manufactured basically as described for the semiconductor device 100, except that as shown in FIG. 2, a first Cu via 116 instead of the first Cu via 115 is buried in the via hole because an misalignment is formed during forming the via hole over the first Cu interconnect 109 and that a second Cu via 132 having a misalignment 139 instead of the second Cu via 131 is further formed over the second Cu interconnect 125.

There will be described the effects of this embodiment.

In the semiconductor device 100, the upper surface of the first interconnect 108 is partly connected to the first plug 114 while the Cu silicide layer 111 is formed in the remaining area, and a cap metal film is not formed between the first interconnect 108 and the first plug 114 and they are in direct contact with respect to one another. Therefore, the upper surface of the first interconnect 108 can be reliably protected while effectively reducing a connection resistance between the first interconnect 108 and the first plug 114. In the semiconductor device 210 described as the related art with reference to FIG. 22, a cap metal is formed over an interconnect and a barrier metal is deposited over the metal, leading to increase in a via resistance. In contrast, in accordance with the configuration of this embodiment, the metal capping is conducted after forming the first interconnect 108 and the first plug 114, so that increase of a via resistance can be prevented.

Figure 22:
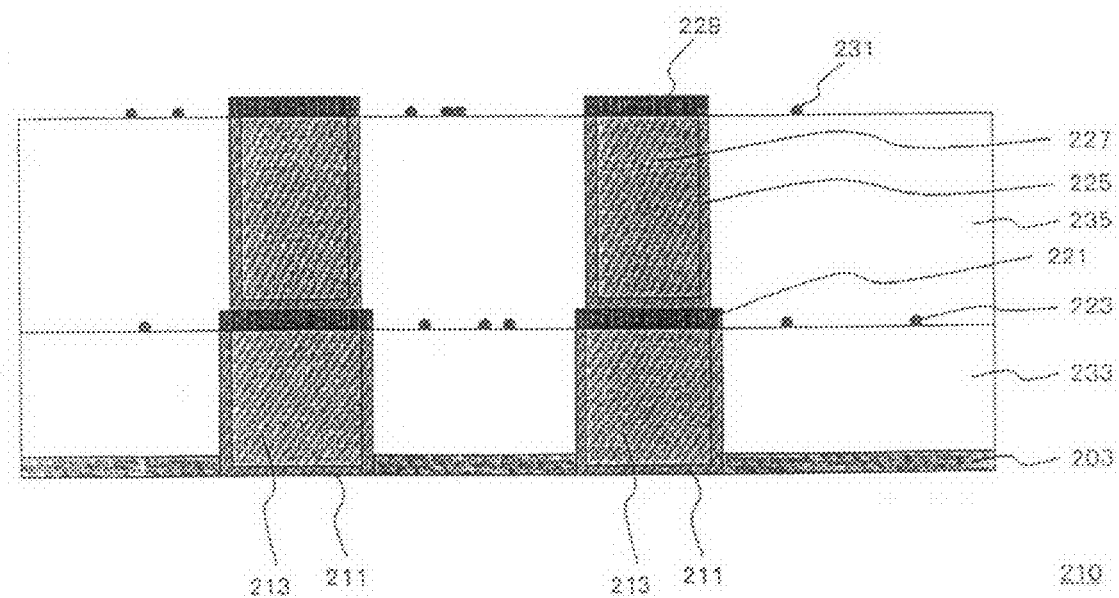

In the semiconductor device 210 described as the related art with reference to FIG. 22, the non-selective deposit 223 and the non-selective deposit 231 may remain, leading to leak between interconnects.

In contrast, in this embodiment, as described above with reference to FIGS. 7 and 8, the first sacrificial $SiO_2$ film 141 is removed during the manufacturing process and the non-selective deposit 159 non-selectively grown on the first sacrificial $SiO_2$ film 141 is lifted off together with the first sacrificial $SiO_2$ film 141 during the removing the first sacrificial $SiO_2$ film 141. Thus, leak between interconnects can be prevented.

The technique of Japanese patent application NO. 2003-152077 described above as the related art essentially requires forming a plug after forming a cap metal over an interconnect. Furthermore, since the contact hole part in the cap metal film formed over the interconnect is etched off in a subsequent step, a removed material may adhere to, for example, the sidewall of the contact hole, leading to, for example, defective formation of a barrier metal film.

In contrast, in this embodiment, the first interconnect 108 and the first plug 114 are formed before their upper surfaces are silicided as a whole to form a cap metal film. Thus, a manufacturing process is simplified and the removing a cap metal is eliminated. Thus, a via hole is not contaminated with a cap metal material, resulting in prevention of defective formation of a barrier metal film.

In Japanese patent application NO. 2003-152077, a TEOS film is formed as a barrier dielectric film over an interconnect to provide a stacked structure of a low dielectric constant insulating film and the TEOS film. Therefore, even when the insulating interlayer is a low dielectric constant film, an effective dielectric constant can not be significantly reduced. Furthermore, there is an interface between the relatively dense TEOS film and the low dielectric constant insulating film in the boundary region where a data ratio sharply varies. In this configuration, a discontinuous plane for a data ratio is in the same level as a discontinuous plane of the film structure, so that detachment in a T/C cycle tends to occur in the interface between the insulating interlayer in a layer where a plug with a low data ratio is to be formed, that is, the low dielectric constant insulating film and the TEOS film.

In contrast, in this embodiment, the sacrificial SiC film 143 acting as a barrier dielectric film is removed during the manufacturing process, to give the continuously integral first porous MSQ film 105 in the region from the side surface of the first interconnect 108 to the side surface of the first plug 114. Thus, an effective dielectric constant can be reduced.

In Japanese patent application NO. 2003-152077, a dual damascene process is used, so that a cap metal is not formed over a plug. In contrast, in this embodiment, the Cu silicide layer 117 acting as a cap metal is also formed on the first plug 114. Therefore, generation of a so-called stress induced void (SIV) can be prevented around an interface between a copper interconnect and a via plug connected to its upper surface. Thus, defective contact or increase in an interconnect resistance can be minimized, resulting in a more reliable semiconductor device.

Furthermore, since the Cu silicide layer 117 acting as a cap metal is also formed over the first plug 114, migration of copper or a copper-containing metal as a constituent metal for an interconnect or plug can be prevented to improve production stability and a production yield in comparison with a dual damascene process as described in Japanese patent application NO. 2003-152077.

Additionally, in the semiconductor device 100, there is not an interface between the first porous MSQ film 105 or the second porous MSQ film 121 and another film in the level of the bottom of the first plug 114 or the second plug 130, respectively. Furthermore, the first porous MSQ film 105 and the second porous MSQ film 121 are films whose composition or physical properties gradually vary along the normal line direction of the film, and there is not a discontinuous plane for a composition or physical properties in the level of the bottom of the first plug 114 or the second plug 130, respectively. Therefore, detachment due to a difference in a thermal expansion coefficient can be avoided in the stacked film, resulting in improvement in thermal cycle properties. Furthermore, the configuration where there is not an interface between films with a different dielectric constant can effectively reduce a dielectric constant of an insulating interlayer.

Furthermore, since there is not a discontinuous plane for a composition or physical properties in the range from the level of the bottom of the first interconnect 108 to the level of the bottom of the first plug 114, detachment or damage can be more reliably prevented in a low density area in the first porous MSQ film 105. In the part above the level of the bottom of the first plug 114, the first porous MSQ film 105 has a higher density than the lower part, there may be a discontinuous plane for a composition or physical properties, but it is preferable that a composition or physical properties of the first porous MSQ film 105 gradually vary without a discontinuous plane. Thus, production stability for an interconnect structure can be further improved.

In this embodiment, the first porous MSQ film 105 has a higher density and thus improved mechanical strength in the vicinity of the upper surface of the first porous MSQ film 105, that is, in the vicinity of its interface with the layer where the second interconnect 124 is to be formed. Furthermore, the second SiCN film 119 is formed between the first porous MSQ film 105 and the second porous MSQ film 121, to allow the second SiCN film 119 to act as a supporting film for the second interconnect 124.

Thus, in the normal line direction of the semiconductor substrate (not shown), the second porous MSQ film 121 with a low density is formed in an area with a higher data ratio in the metal film for adequately reduce a specific dielectric constant to reduce a capacity between interconnects. At the same time, in a boundary plane with an area where the first plug 114 is to be formed, the second SiCN film 119 is formed as an underlying layer for the second porous MSQ film 121 for ensuring adequate strength of an area where the area for forming the porous MSQ film drastically becomes smaller, that is, the second SiCN film 119 reinforces the second porous MSQ film 121. Thus, the second porous MSQ film 121 and the first porous MSQ film 105 are formed as a continuously integral part. Therefore, the strength of an interconnect structure can be much more improved in comparison with the configuration where the region around the interface between the first plug 114 and the second interconnect 124 is covered by a single film.

Figure 21:
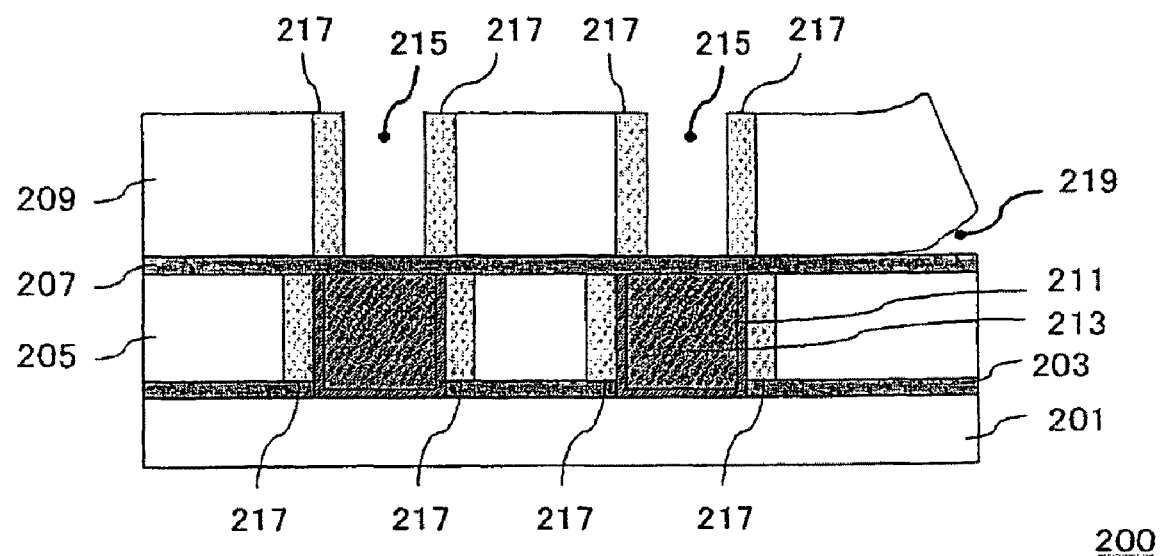
FIGS. 21 and 22 are cross-sectional views illustrating a conventional semiconductor device.

The first porous MSQ film 105 is a film which is buried after forming the first interconnect 108 and the first plug 114. It, therefore, leads to elimination of a refining step after deposition of the first porous MSQ film 105, resulting in absence of etching or ashing of the first porous MSQ film 105. Thus, damage in the vicinity of the interface between the first interconnect 108 and the first plug 114 can be prevented. Therefore, formation of a damaged layer 217 generated in the case as described with reference to FIG. 21 can be prevented, resulting in improved production stability.

After forming the first interconnect 108, a via hole 147 is formed while the first sacrificial $SiO_2$ film 141 and the sacrificial SiCN film 143 which are to be later removed remain being stacked (FIG. 3). Thus, even when a misalignment is generated during forming the via hole 147 as shown in FIG. 2, etching of the via hole can be prevented from proceeding in the depth direction in the misalignment 137. Therefore, defective burying properties can be prevented in the barrier metal film 113 and the first Cu via 115 which constitute the first plug 114. Thus, production stability can be improved when a misalignment is generated. Furthermore, during forming the via hole 147, the sacrificial SiC film 143 which act as an etching stopper film and the first sacrificial $SiO_2$ film 141 are processed, that is, the step of processing a so-called unlanded via in the first porous MSQ film 105 is eliminated. Therefore, even when a misalignment is present, the first plug 118 can be reliably formed in the first porous MSQ film 105.

Although there has been described a case where a low dielectric constant film is a porous MSQ film, the insulating film may be a polyorganosiloxane film, a siloxane hydride film or any porous film thereof in this embodiment or the embodiments below. These films may be, for example, formed by, but not limited to, CVD or application.

Examples of a polyorganosiloxane include
methylpolysiloxanes such as MSQ (methylsilsesquioxane);
methyl hydrogen polysiloxanes such as MHSQ (methyl hydrogen silsesquioxane);
OSG (Organo-Silicate Glass); and
CDO (Carbon Doped Oxide).
Examples of a siloxane hydride include
HSQ (hydrogen silsesquioxane); and
ladder oxides such as a ladder type siloxane hydride. Among these, a ladder type siloxane hydride is a polymer having a ladder type molecular structure, and preferably has a dielectric constant of 2.9 or less in the light of preventing interconnect delay and has a low film density. For example, it is preferable that a film density is 1.50 g/cm² to 1.58 g/cm² both inclusive and a refractive index at 633 nm is 1.38 to 1.40 both inclusive. A specific example of such a film material is L-Ox™ (trademark) (hereinafter, simply referred to as "L-Ox") which is known as a ladder oxide. A porous L-Ox can be used as an insulating material.

A low dielectric constant insulating film may be a film of an organic resin including:
parylene resins;
fluororesins such as Cytop (registrated trademark);
non-fluorinated aromatic-containing organic resins such as SiLK (registrated trademark);
polyaryl ether (PAE); and
polyphenylene.
A specific dielectric constant of the low dielectric constant film may be, for example, 3.5 or less, preferably 3 or less. The low dielectric constant film may contain Si, O and H as constituent elements. Alternatively, the low dielectric constant film may contain Si, C, O and H as constituent elements.

Although in this embodiment, there has been described the configuration where the reinforcing insulating film formed directly under the first porous MSQ film 105 and the second porous MSQ film 121 is an SiC film, the reinforcing insulating film may be any film as long as it has a higher density than the first porous MSQ film 105 or the second porous MSQ film 121 and can reinforce the surface of the low dielectric constant insulating interlayer formed in an interface between the interconnect layer and the plug layer, specifically a weak region with a lower density in the vicinity of the bottom of the low dielectric constant insulating interlayer. For example, an SiCN or SiON film may be used instead of the SiC film.

A combination of the low dielectric constant film and the reinforcing insulating film may be a combination of a polyorganosiloxane film, a siloxane hydride film or any porosified one thereof described above as an insulating film and an SiC film, an SiCN film or an SiON film as a reinforcing insulating film. More preferably, a combination of a porous SiOC film with SiC is used.

There will be essentially described different elements from Embodiment 1 in the following embodiments.

Embodiment 2

Although there has been described the configuration where the first porous MSQ film 105 and the second porous MSQ film 121 are solid in Embodiment 1, there may be an air gap in an insulating film formed from the sidewall of the first interconnect 108 to the sidewall of the first plug 114 such that it covers the sidewall of the first interconnect 108, the upper portion of the first interconnect 108 and the sidewall of the first plug 114. Furthermore, there may be also an air gap in an insulating film formed from the sidewall of the second interconnect 124 to the sidewall of the second plug 130. This embodiment will describe such an aspect.

Figure 12:
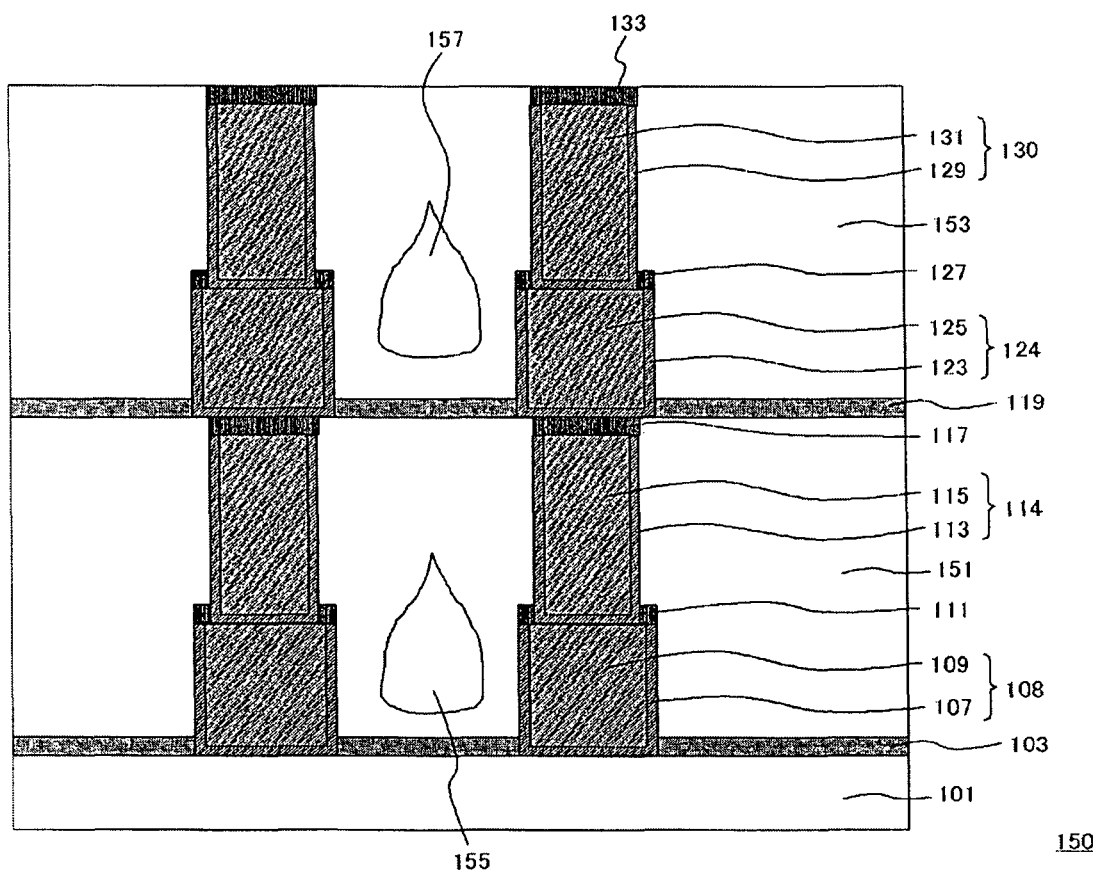
FIGS. 12 and 13 are cross-sectional views illustrating the configuration of a semiconductor device according to an embodiment.
Figure 13:
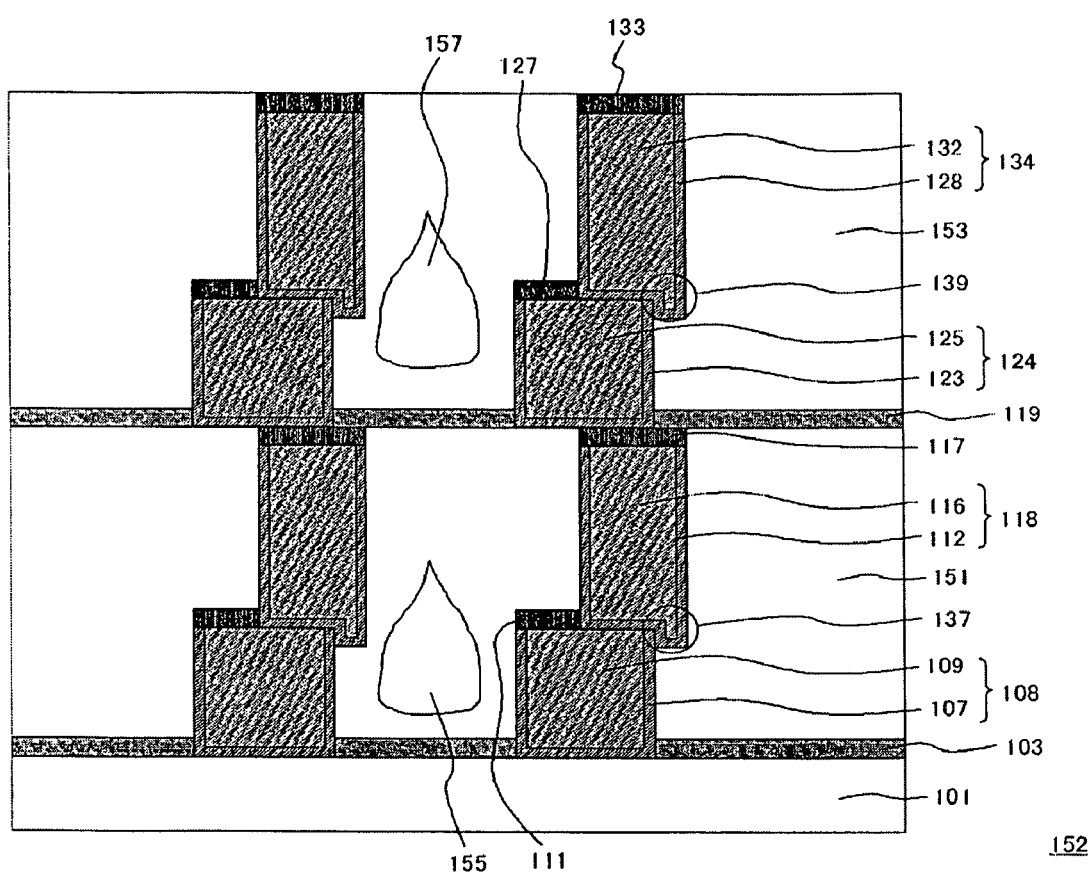

FIGS. 12 and 13 are cross-sectional views illustrating the configuration of the semiconductor device according to this embodiment. The semiconductor device 152 shown in FIG. 13 has the configuration as in the semiconductor device 150 shown in FIG. 12, except that there is generated a misalignment in the junction between an interconnect and a via.

The semiconductor devices shown in FIGS. 12 and 13 have the basic configuration as in the semiconductor devices shown in FIGS. 1 and 2, respectively, except that a first $SiO_2$ film 151 and a second $SiO_2$ film 153 are substituted for the first porous MSQ film 105 and the second porous MSQ film 121, respectively. The first $SiO_2$ film 151 and the second $SiO_2$ film 153 have air gaps 155 and 157, respectively. The air gaps 155 and 157 are formed between the first interconnects 108, and in the second porous MSQ film 121 and its periphery, respectively. The first $SiO_2$ film 151 and the second $SiO_2$ film 153 may be a film without a compositional or density distribution.

There will be described a process for manufacturing the semiconductor device of this embodiment.

The semiconductor devices 150 and 152 can be manufactured as described for manufacturing the semiconductor devices 100 and 110 in Embodiment 1, respectively. The first $SiO_2$ film 151 and the second $SiO_2$ film 153 are formed in place of the first porous MSQ film 105 and the second porous MSQ film 121, respectively. Forming the first $SiO_2$ film 151 and the second $SiO_2$ film 153 contains forming the air gap 155 and the air gap 157, respectively.

Specifically, in the manufacturing process for the semiconductor device 150, the first SiCN film 103, the first interconnect 108 and the first plug 114 are exposed on the $SiO_2$ film 101 as described above with reference to FIGS. 3 to 8.

Figure 14:
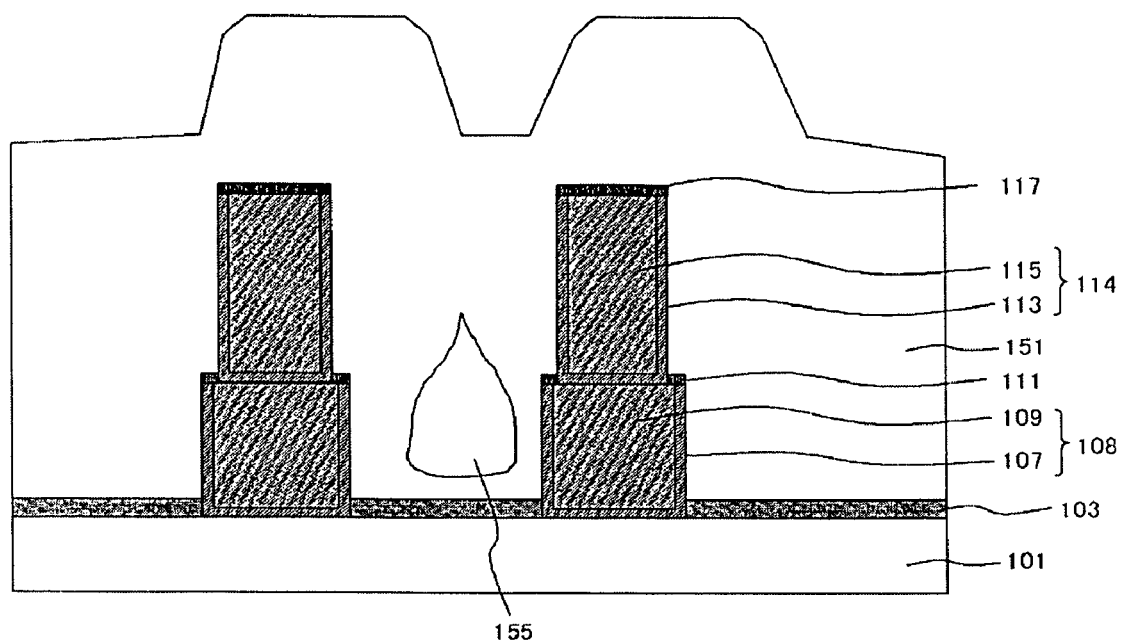
FIGS. 14 and 15 are cross-sectional views illustrating a process for manufacturing the semiconductor device shown in FIG. 12.

Then, over the first SiCN film 103 is deposited the first $SiO_2$ film 151 as a low dielectric constant film, and the area between the first interconnects 108 is filled such that the air gap 155 is formed. Here, a height from the upper surface of the first SiC film 103 to the upper surface of the Cu silicide layer 117 is larger than the width of the first interconnect 108. Thus, an aspect ratio of the concave in which the first $SiO_2$ film 151 is buried can be increased, so that the air gap 155 can be reliably formed. The first $SiO_2$ film 151 is deposited by plasma CVD, whose conditions are, for example, 350° C. to 400° C. both inclusive and 5 Torr to 8 Torr both inclusive. Thus, the air gap 155 is formed in the first $SiO_2$ film 151 (FIG. 14).

Figure 15:
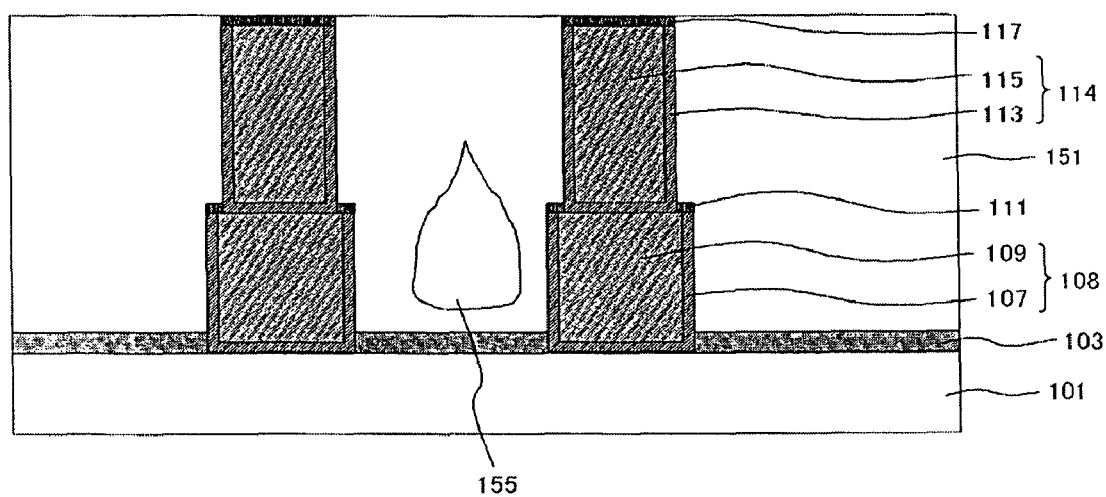

Then, using the Cu silicide layer 117 as a CMP mask, the first $SiO_2$ film 151 is processed by CMP, to planarize the surface of the first $SiO_2$ film 151 (FIG. 15). Next, the above procedure is repeated from the forming the second SiC film 119, to expose the second SiC film 119, the second interconnect 124 and the second plug 130 on the first $SiO_2$ film 151. Then, the second $SiO_2$ film 153 is filled between the second Cu interconnects 125 and between the second plugs 130 while forming an air gap 157 in the second $SiO_2$ film 153. The second $SiO_2$ film 153 can be formed as described for forming the first $SiO_2$ film 151. Subsequently, the second $SiO_2$ film 153 is planarized for forming the multilayer interconnect structure shown in FIG. 12 to provide the semiconductor device 150.

Although the semiconductor device 152 shown in FIG. 13 is manufactured basically as described for the semiconductor device 150, a misalignment is generated when forming a via hole over the first Cu interconnect 109 and thus, the first Cu via 116 instead of the first Cu via 115 is filled in the via hole having the misalignment 137. In addition, over the second Cu interconnect 125, the second Cu via 132 having a misalignment 139 is formed instead of the second Cu via 131.

There will be described the effects of this embodiment.

Again, in this embodiment, a continuously integral first $SiO_2$ film 151 is formed from the side surface of the first interconnect 108 to the side surface of the first plug 114. Furthermore, the first $SiO_2$ film 151 is formed after forming the first interconnect 108 and the first plug 114. The layer of the second $SiO_2$ film 153 also has a similar configuration. In the upper surface of the interconnect, a cap metal is deposited in the area other than the area where a plug is to be formed. Furthermore, the lower side surfaces of the first interconnect 108 and the second interconnect 124 are supported by the first SiC film 103 and the second SiC film 119, respectively. Therefore, effects comparable to Embodiment 1 are achieved.

The first $SiO_2$ film 151 and the second $SiO_2$ film 153 acting as an insulating interlayer are formed by plasma CVD. Using this method, an air gap is formed in an area where an interconnect interval is small while a structure which can be formed by an $SiO_2$ film without an air gap is formed in an area where the interval is large. Thus, a dielectric constant can be reduced and mechanical strength can be ensured in a part in need thereof. Furthermore, a reinforcing process such as electron beam or UV ray irradiation after film deposition can be eliminated, resulting in further simplifying the manufacturing process.

Although there has been described the exemplary configuration where insulating interlayers having the air gaps 155 and 157 are the first $SiO_2$ film 151 and the second $SiO_2$ film 153, a low dielectric constant film such as an SiOC film can be used in place of an $SiO_2$ film. Thus, as in an $SiO_2$ film, an air gap is formed in an area where an interconnect interval is small, and an effective dielectric constant can be further reduced in comparison with the case using an $SiO_2$ film. In addition, these insulating films may be made of another material, for example, as listed in Embodiment 1.

When using a low dielectric constant film, a specific dielectric constant of an insulating interlayer may be, for example, 3.5 or less, preferably 3.2 or less. Thus, a capacity between interconnects for the first interconnect 108 and the second interconnect 124 can be suitably reduced. Furthermore, a specific dielectric constant of an insulating interlayer may be, for example, 2.0 or more, preferably 2.5 or more. Thus, strength of the insulating interlayer can be further improved, resulting in further improvement in thermal cycle properties.

Embodiment 3

The semiconductor device in Embodiment 2 may have a configuration without the first SiC film 103 or the second SiC film 119.

Figure 16:
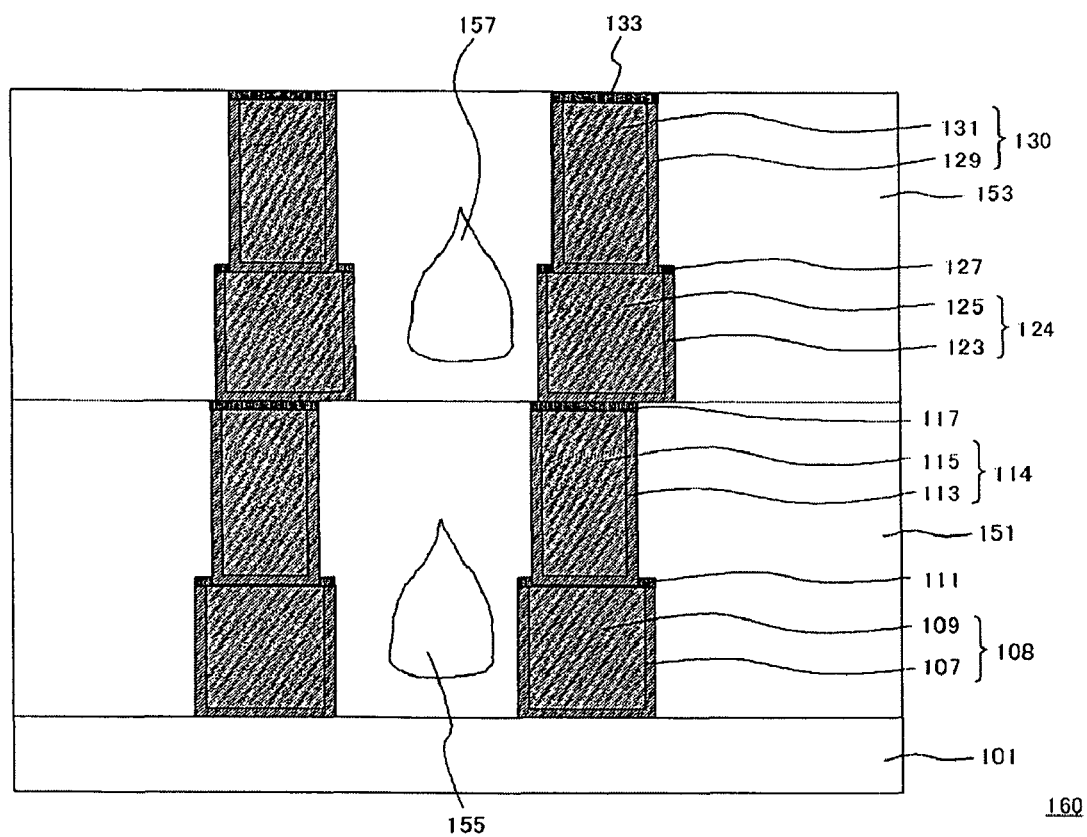
FIGS. 16 to 19 are cross-sectional views illustrating the configuration of a semiconductor device according to an embodiment.
Figure 17:
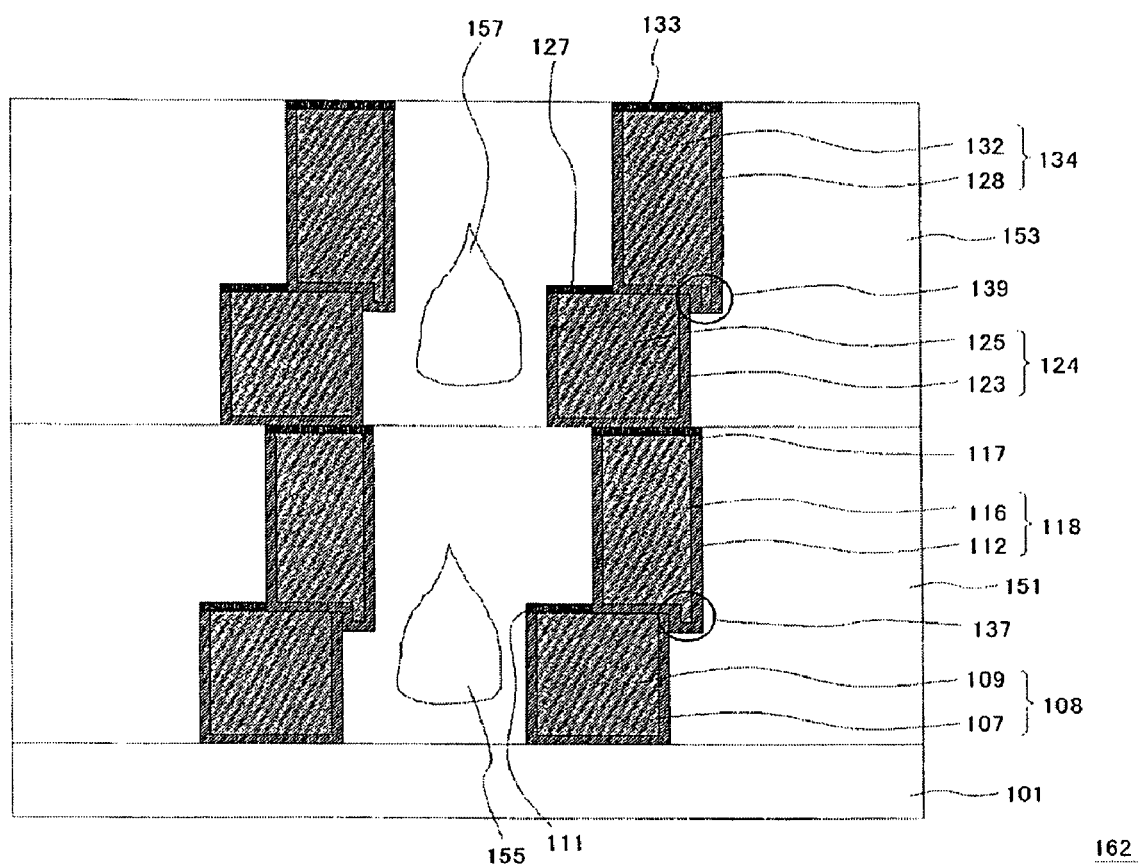

FIGS. 16 and 17 are cross-sectional views illustrating the configuration of the semiconductor device according to this embodiment. A semiconductor device 162 shown in FIG. 17 has the configuration as in a semiconductor device 160 shown in FIG. 16, except that a misalignment is generated in the junction between an interconnect and a via.

The semiconductor devices shown in FIGS. 16 and 17 have the basic configurations as described for the semiconductor device 150 (FIG. 12) and the semiconductor device 152 (FIG. 13) in Embodiment 2, respectively, except that the first SiC film 103 or the second SiC film 119 is not formed.

The semiconductor device 160 and the semiconductor device 162 can be manufactured as described for manufacturing the semiconductor device 150 and the semiconductor device 152 in Embodiment 2, although, after removing the first sacrificial SiO$_2$ film 141 (FIG. 8), the first SiC film 103 is etched back and off by dry etching before forming the first SiO$_2$ film 151 (FIG. 14). Furthermore, the second SiC film 119 is removed before forming the second SiO$_2$ film 153.

According to this embodiment, the first SiC film 103 or the second SiC film 119 is absent, so that in comparison with the configuration of Embodiment 2, an effective dielectric constant of an insulating film can be further effectively reduced. In this embodiment, even when a misalignment is generated between the first plug 118 and the first interconnect 108 as in the semiconductor device 162 shown in FIG. 17, Cu diffusion into the insulating interlayer can be prevented because the Cu silicide layer 117 as a cap metal is formed on the first plug 118.

Embodiment 4

In the configurations of Embodiments 1 and 2, a cap metal may be absent on a plug. There will be, as an example, described the configuration of Embodiment 1, but the configuration of this embodiment may be applied to that in Embodiment 2.

Figure 18:
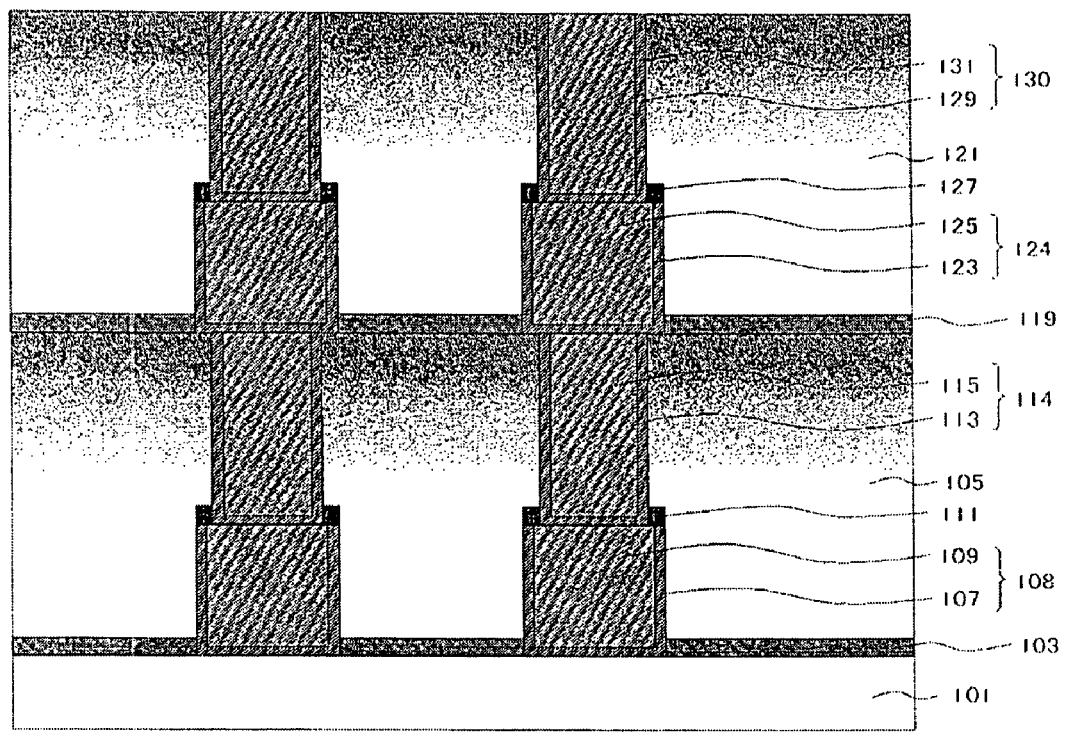
Figure 19:
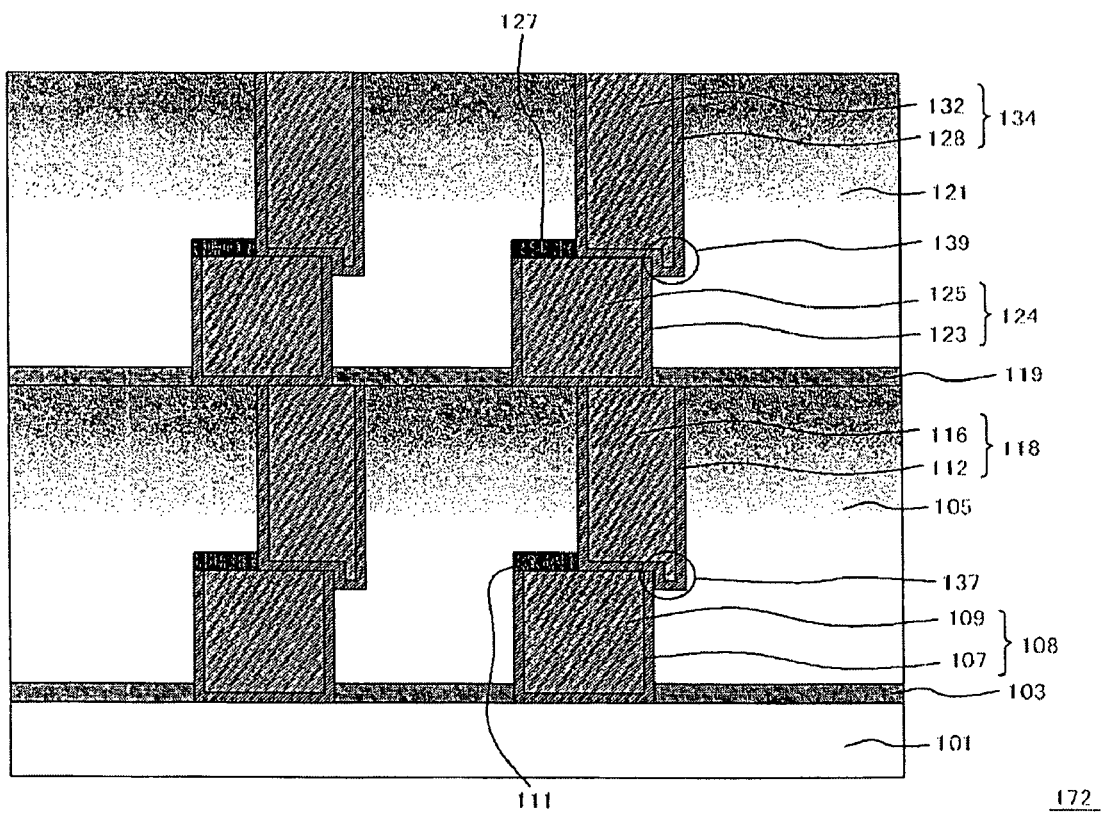

FIGS. 18 and 19 are cross-sectional views illustrating the configuration of the semiconductor device according to this embodiment. A semiconductor device 172 shown in FIG. 19 has a configuration as for a semiconductor device 170 shown in FIG. 18, except that a misalignment is generated in a junction between an interconnect and a via.

The semiconductor devices shown in FIGS. 18 and 19 have the basic configurations as described for the semiconductor device 100 (FIG. 1) and the semiconductor device 110 (FIG. 2) in Embodiment 1, respectively, except that the Cu silicide layer 117 or the Cu silicide layer 133 is not formed. The first interconnect 108 is in contact with the first plug 114 or the first plug 118 without a Cu silicide layer. The second interconnect 124 is also in contact with the second plug 130 or the second plug 134 without a Cu silicide layer. The semiconductor device 170 and the semiconductor device 172 have the second interconnect 124 formed on and in contact with the first plug 114, and the second reinforcing insulating film (the second SiC film 119) in contact with the lower side surface of the second interconnect 124 and having a higher film density than the first porous MSQ film 105, and a plug protecting film is the second SiC film 119. An SiN or SiON film may be substituted for the second SiC film 119.

A process for manufacturing the semiconductor device according to this embodiment has, after forming the first porous MSQ film 105, mechanically and chemically polishing the first porous MSQ film 105 and the Cu silicide layer 117 to remove the first porous MSQ film 105 over the first plug 114 and the Cu silicide layer 117 over the first plug 114. The process further has, after removing the Cu silicide layer 117 over the first plug 114, forming an insulative plug protecting film (the second SiC film 119) over the first porous MSQ film 105.

More specifically, the semiconductor device 170 and the semiconductor device 172 can be manufactured as described for manufacturing the semiconductor device 100 and the semiconductor device 110 in Embodiment 1, although, after planarizing the first porous MSQ film 105 (FIG. 11), the Cu silicide layer 117 is further removed by CMP, and after planarizing the second porous MSQ film 121, the Cu silicide layer 133 is further removed by CMP. These Cu silicide layers are removed by, for example, removing the first porous MSQ film 105 over the Cu silicide layer 117 by polishing using the Cu silicide layer 117 as a mask and then conducting polishing by means of a slurry which cannot polish a Cu film but a Cu silicide layer. In contrast to Embodiment 3, the first SiC film 103 and the second SiC film 119 remain as a plug protecting film in this embodiment.

According to this embodiment, a cap metal is absent over the first plug 114, the first plug 118, the second plug 130 and the second plug 134, so that a connection resistance between any of these plugs and an interconnect thereon can be more effectively reduced. Furthermore, in this embodiment, the upper surfaces of the first plug 114 and the first plug 118 are covered by the second SiC film 119, so that Cu diffusion into the insulating interlayer can be prevented.

There has been described this invention with reference to some embodiments. It will be apparent to those skilled in the art that these embodiments are merely illustrative, many variations may be possible and such variations are encompassed by the present invention.

For example, in the above embodiments, a film density of an insulating film can be determined by TEM (transmission electron microscopy) for the cross section of a semiconductor device.

Although there has been described a configuration having a stack of two interconnect structures in which a plug is formed on an interconnect layer in this embodiment, there are no particular restrictions to the number of stacked interconnect structures. The configuration of this embodiment can be used to effectively reduce a connection resistance between interconnects and a capacity between interconnects even in a stack of three or more layers and to improve production stability.

Although there has been described the case where a Cu silicide layer is selectively grown as a cap metal film by CVD in this embodiment, a Cu silicide nitride layer may be selectively grown. Alternatively, a cap metal film may be formed by selective plating of a CoWP or CoWB film, or a W film may be selectively grown by CVD.

EXAMPLE

In this example, variation in film quality by post-treatment after deposition was investigated for a porous SiOC as a material for low dielectric constant insulating interlayer.

A porous SiOC film with a thickness of about 200 nm was formed and irradiated with EB (Electron Beam), and film quality was improved. For example, EB irradiation at 0.2 mC/cm$^2$ and 350 degree C. under an atmosphere with an oxygen concentration of 100 ppm or less gave, at a dielectric constant of 2.35, a mechanical strength (Modulus) of up to 7 GPa, indicating improvement by about two folds or more in comparison with that before the EB treatment.

TEM (transmission electron microscopy) for the cross section of the porous SiOC film before and after the treatment of EB irradiation indicated that the EB irradiated side had a higher density than the opposite side. The film had a higher density as a distance from the rear face of the EB irradiated side is increased, and there were no regions where a density discontinuously varied.

Figure 20:
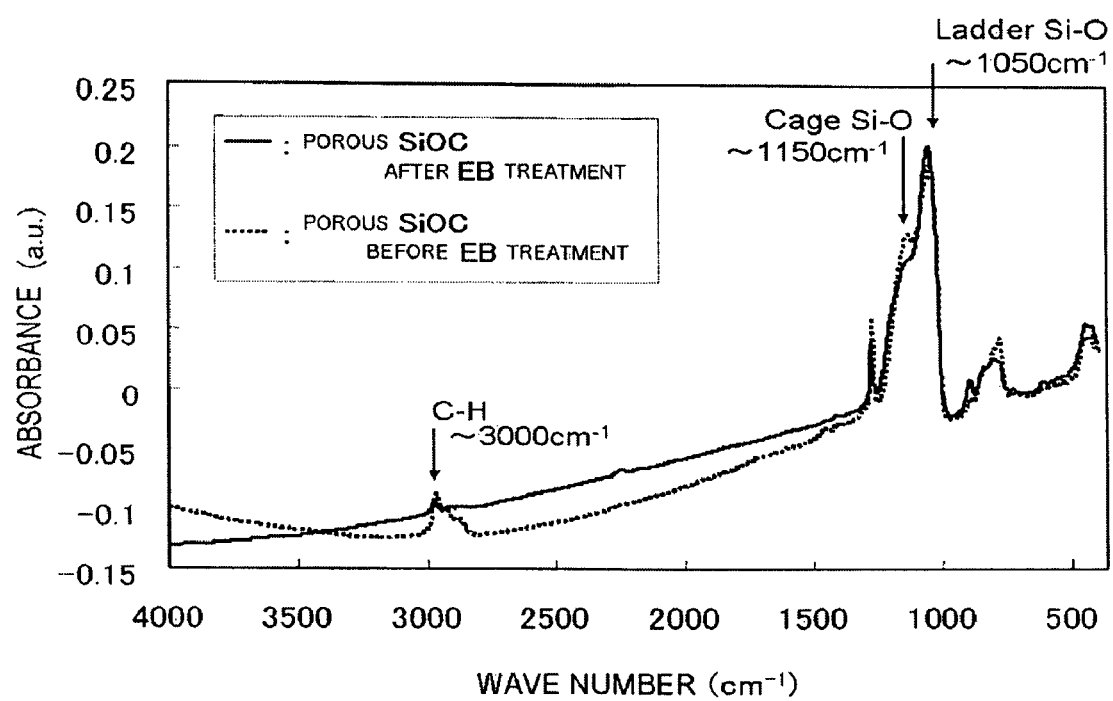
FIG. 20 is a graph showing an FTIR spectrum of a porous SiOC film in an example.

Film quality was then evaluated by FTIR spectrometry (Furier Transmittance Infra Red Spectrometry). FIG. 20 is a graph showing an FTIR spectrum of the porous SiOC film. FIG. 20 gave an absorption spectrum of a bond having a peak at about 1150 cm$^{-1}$ (1100 to 1200 cm$^{-1}$) probably indicating a Cage type Si—O structure, and of a bond having a peak at about 1050 cm$^{-1}$ (1000 to 1100 cm$^{-1}$) probably indicating a Ladder type Si—O structure, before EB irradiation. In contrast, after the EB irradiation described above, a peak intensity around 1150 cm$^{-1}$ reflecting a Cage type Si—O structure was reduced while a peak intensity around 1050 cm$^{-1}$ reflecting a Ladder type Si—O structure was increased. Thus, EB irradiation could change the Si—O bond state.

The film was treated as described above, for a porous SiOC film with a larger thickness. Then, a distribution in the film structure was generated in the depth direction. Specifically, the surface part was richer in the Ladder type Si—O structure than the deeper part while the deeper part was richer in the Cage type Si—O structure than the shallower part.

The EB irradiation reduced a peak intensity of an absorption band of a bond having a peak around 3000 cm$^{-1}$ derived from C—H bond. It may indicate that a carbon concentration in the EB irradiated side became lower than the opposite side.

By further increasing an EB dose, mechanical strength could be further improved. It was observed that in the film after the EB irradiation, Si—O bonds were increased while C—H bonds were reduced in the EB irradiated side, in comparison with that before.

A similar tendency was observed when using a UV (ultraviolet)-ray lamp instead of EB.

A similar EB irradiation effect was observed when using polysiloxane hydride in place of SiOC as a low dielectric constant material.

It is apparent that the present invention is not limited to the above embodiment, that may be modified and changed without departing from the scope and spirit of the invention.

What is claimed is:

1. A semiconductor device having an interconnect structure, comprising:
   a semiconductor substrate;
   a first interconnect made of a copper-containing metal which is formed over said semiconductor substrate;
   a conductive plug formed over said first interconnect and connected to said first interconnect;
   a copper silicide first cap metal film over said first interconnect in an area other than the area where said plug is formed, said first cap metal not being formed over an area of said first interconnect where said plug is formed so as to form shoulders of the first interconnect;
   a copper silicide plug protecting film formed over said conductive plug;
   a second interconnect formed over said conductive plug, a lower surface of said second interconnect having a first area and a second area, said plug protecting film being formed under said first area of the lower surface of said second interconnect, said plug protecting film being not formed under said second area of the lower surface of said second interconnect, said second area extending outside said first area to form overhangs, said second interconnect being connected to said conductive plug via said plug protecting film; and
   an insulating film formed over an area from a side surface of said first interconnect to a side surface of said plug and covering the side surface of said first interconnect, an upper portion of said first interconnect and the side surface of said plug.

2. The semiconductor device as claimed in claim 1, wherein said first cap metal film is a film formed by siliciding the upper portion of said first interconnect.

3. The semiconductor device as claimed in claim 1, wherein said plug protecting film is a second cap metal film made of the copper silicide.

4. The semiconductor device as claimed in claim 3, wherein a second interconnect connected to said plug via said second cap metal film is formed over said plug.

5. The semiconductor device as claimed in claim 1, wherein an air gap is formed in said insulating film.

6. The semiconductor device as claimed in claim 1, wherein
   a plurality of said interconnect structures are stacked; and
   said plug in the lower interconnect structure is connected to said first interconnect in the upper interconnect structure.

7. The semiconductor device as claimed in claim 1, further comprising an SiC film under the insulating film and in contact with a bottom of the side surface of the first interconnect.

8. The semiconductor device as claimed in claim 1,
   wherein said first interconnect, said conductive plug, and said second interconnect are made of copper, and said plug protecting film is a second cap metal film made of copper silicide.

9. A semiconductor device having an interconnect structure, comprising:
   a semiconductor substrate;
   a first interconnect which is formed over said semiconductor substrate;
   a conductive plug formed over said first interconnect and connected to said first interconnect;
   a copper silicide first cap metal film over said first interconnect, said first cap metal film being formed only in a non-contact area with said conductive plug;
   a copper silicide plug protecting film formed on said conductive plug, said plug protecting film being in contact with said conductive plug;
   a second interconnect formed over said conductive plug, a lower surface of said second interconnect having a first area and a second area, said plug protecting film being formed under said first area of the lower surface of said second interconnect, said plug protecting film being not formed under said second area of the lower surface of said second interconnect, said second area extending outside said first area to form overhangs, said second interconnect being connected to said conductive plug via said plug protecting film; and
   an insulating film formed over an area from the side surface of said first interconnect to the side surface of said conductive plug and covering the side surface of said first interconnect, the upper portion of said first interconnect and the side surface of said conductive plug so as to form shoulders of the first interconnect,
   wherein said plug protecting film is a second cap metal film made of a same material as said first cap metal film.

10. The semiconductor device as claimed in claim 9, wherein said first interconnect, said conductive plug, and said second interconnect are made of copper.

* * * * *